(12) United States Patent
Penzo et al.

(10) Patent No.: US 11,854,620 B2
(45) Date of Patent: Dec. 26, 2023

(54) WORD LINE ZONED ADAPTIVE INITIAL PROGRAM VOLTAGE FOR NON-VOLATILE MEMORY

(71) Applicant: SanDisk Technologies LLC, Addison, TX (US)

(72) Inventors: Erika Penzo, San Jose, CA (US); Han-Ping Chen, San Jose, CA (US); Henry Chin, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 265 days.

(21) Appl. No.: 17/351,533

(22) Filed: Jun. 18, 2021

(65) Prior Publication Data

US 2022/0406380 A1    Dec. 22, 2022

(51) Int. Cl.

| | | |
|---|---|---|
| *G11C 16/04* | (2006.01) | |
| *G11C 16/08* | (2006.01) | |
| *G11C 11/56* | (2006.01) | |
| *G11C 16/10* | (2006.01) | |
| *G11C 16/34* | (2006.01) | |
| *H10B 41/27* | (2023.01) | |
| *H10B 43/27* | (2023.01) | |

(52) U.S. Cl.
CPC .......... *G11C 16/08* (2013.01); *G11C 11/5628* (2013.01); *G11C 11/5671* (2013.01); *G11C 16/0483* (2013.01); *G11C 16/10* (2013.01); *G11C 16/3459* (2013.01); *H10B 41/27* (2023.02); *H10B 43/27* (2023.02)

(58) Field of Classification Search
CPC . G11C 16/08; G11C 11/5671; G11C 16/0483; G11C 16/3459; G11C 16/20; G11C 16/349; G11C 11/5628; G11C 16/10; H10B 41/27; H10B 43/27
See application file for complete search history.

(56) References Cited

U.S. PATENT DOCUMENTS

| | | | |
|---|---|---|---|
| 7,339,834 B2 | 3/2008 | Lutze | |
| 7,564,715 B2 | 7/2009 | Mokhlesi | |
| 7,881,116 B2 | 2/2011 | Nagashima et al. | |
| 8,971,128 B2 | 3/2015 | Chin et al. | |
| 9,269,444 B2 | 2/2016 | Chin et al. | |
| 9,792,999 B2 | 10/2017 | Lee et al. | |
| 10,614,898 B1 | 4/2020 | Yang et al. | |
| 2011/0051510 A1* | 3/2011 | Honma | G11C 16/3459 365/185.21 |
| 2018/0075919 A1* | 3/2018 | Pang | G11C 16/16 |

\* cited by examiner

*Primary Examiner* — Uyen Smet
(74) *Attorney, Agent, or Firm* — Vierra Magen Marcus LLP

(57) ABSTRACT

An apparatus is provided that includes a plurality of word lines that include a plurality of word line zones, a plurality of non-volatile memory cells coupled to the plurality of word lines, and a control circuit coupled to the non-volatile memory cells. The control circuit is configured to determine a corresponding initial program voltage for each of the word line zones. Each corresponding initial program voltage is determined based on a number of program erase cycles.

18 Claims, 20 Drawing Sheets

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

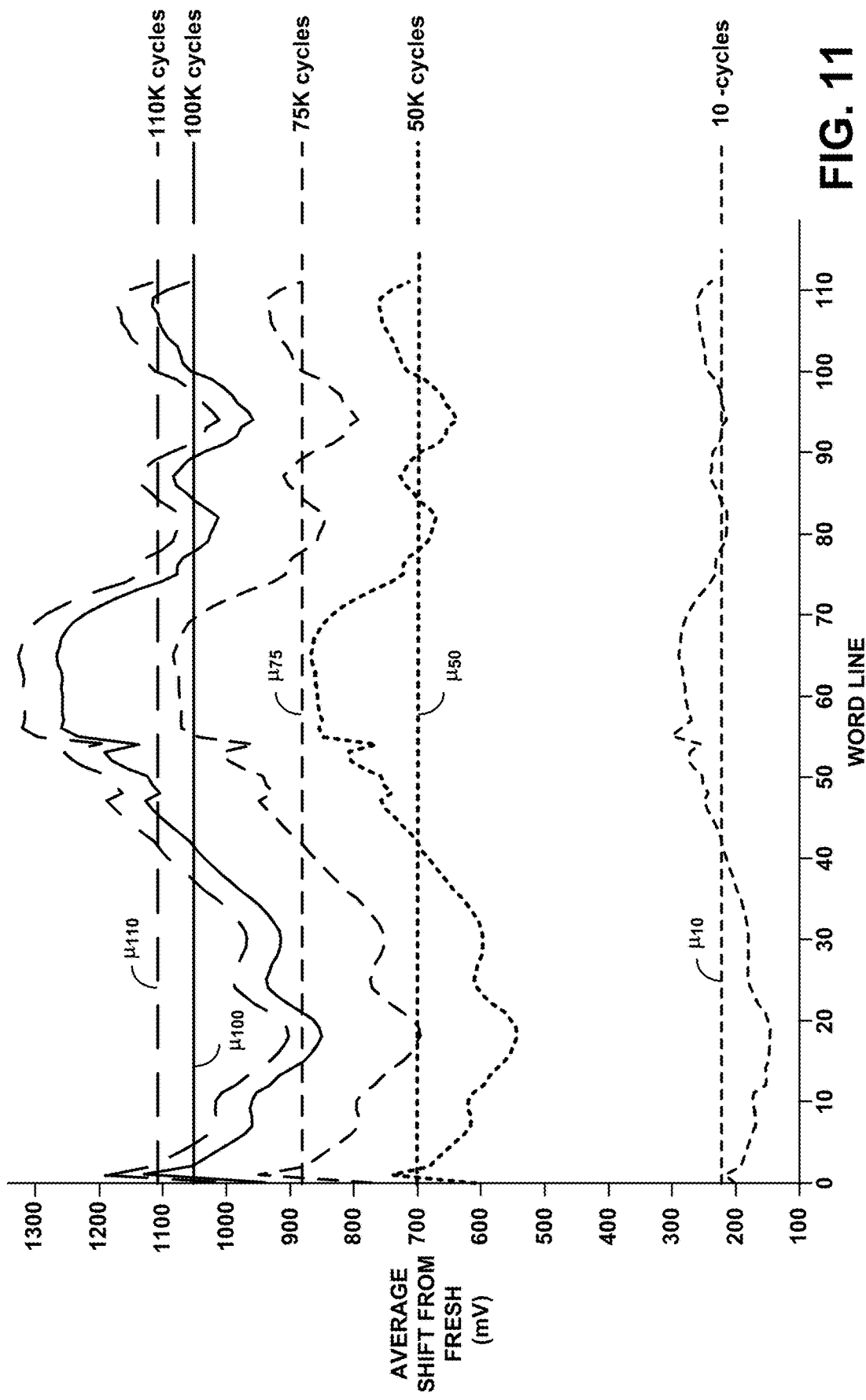

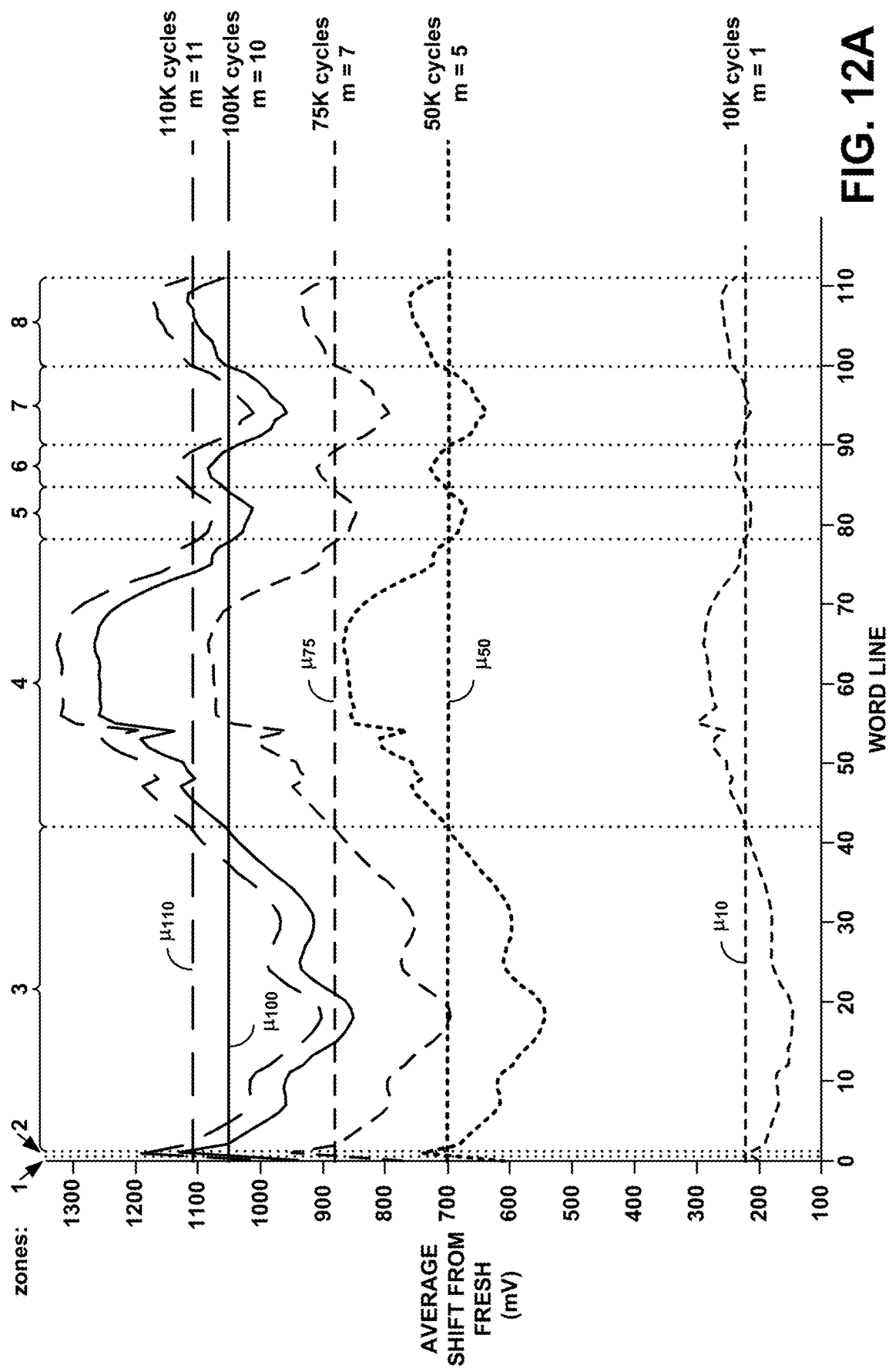

WORD LINE ZONED ADAPTIVE INITIAL PROGRAM VOLTAGE FOR NON-VOLATILE MEMORY

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device (or other client). However, various challenges are presented in operating such memory systems. In particular, as memory cells decrease in size and memory arrays increase in density, maintaining the integrity of data being stored becomes more challenging.

BRIEF DESCRIPTION OF THE DRAWINGS

Like-numbered elements refer to common components in the different figures.

FIGS. 7A-7E depict various threshold voltage distributions and describe a process for programming non-volatile memory.

FIG. 11 depicts example values of an average shift in the lower tail of a programmed state threshold voltage distribution after cycling compared with fresh as a function of word line number.

FIGS. 12A-12B depict an example embodiment of a word line zoned adaptive program voltage technique.

DETAILED DESCRIPTION

Some non-volatile memory devices are used to store two ranges of charges and, therefore, the memory cells can be programmed/erased between two data states: an erased state and a programmed state (corresponding to data "1" and data "0"). Such a device is referred to as a binary device or a single-level cell (SLC) and the data are binary data.

In contrast, a multi-state flash memory cell (storing multi-state data) is implemented by identifying multiple, distinct allowed threshold voltage ranges. Each distinct threshold voltage range corresponds to a predetermined value for the set of data bits. For example, some memory cells can store two or more bits. The specific relationship between the data programmed into the memory cell and the threshold voltage ranges of the memory cell depends upon the data encoding scheme adopted for the memory cells.

In addition to the gains in capacity resulting from multi-state memory architectures, significant advantages in memory technology have resulted from steadily scaling down the physical dimensions of memory cells. Smaller memory cells can be packed more densely on a given die area, allowing higher memory capacity for the same price as an older memory technology.

Technology is described to provide a word line zoned adaptive initial program voltage technique that divides word lines of a memory array into multiple word line zones. For each word line zone, an initial program voltage is determined based on a number of program-erase cycles and an average increase of programmed state threshold voltage Vt position with cycling across word lines in the word line zone.

Figure 1:
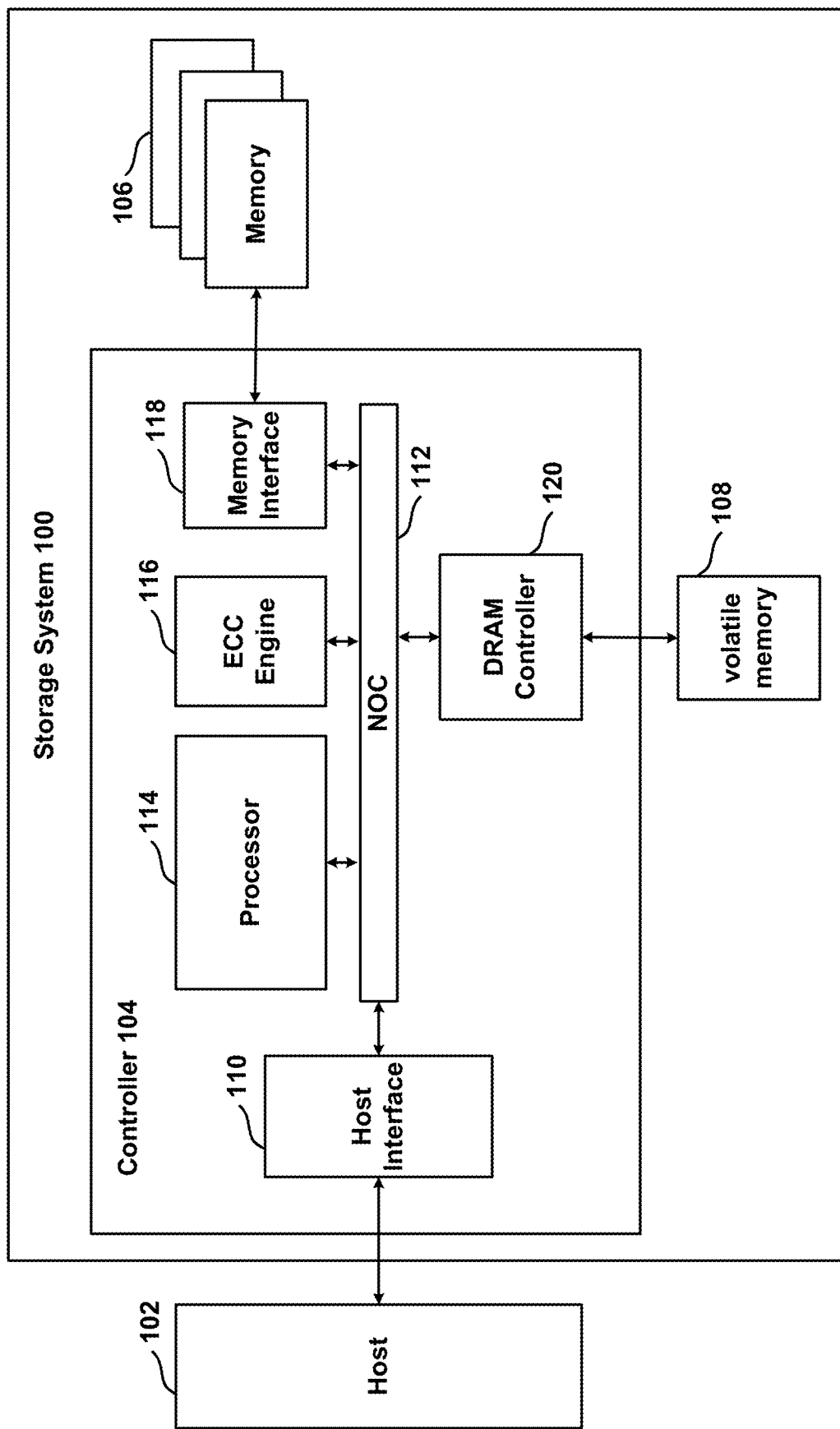
FIG. 1 is a block diagram depicting one embodiment of a memory system.

FIG. 1 is a block diagram of an embodiment of a memory system 100 that implements the described technology. In an embodiment, memory system 100 is a solid state drive ("SSD"). Memory system 100 also can be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 104 connected to one or more memory die 106 and local high speed volatile memory 108 (e.g., DRAM). The one or more memory die 106 each include a plurality of non-volatile memory cells. More information about the structure of each memory die 106 is provided below. Local high speed volatile memory 108 is used by controller 104 to perform certain functions. For example, local high speed volatile memory 108 stores logical to physical address translation tables ("L2P tables")

Controller 104 includes a host interface 110 that is connected to and in communication with host 102. In one embodiment, host interface 110 provides a PCIe interface. Other interfaces can also be used, such as SCSI, SATA, etc. Host interface 110 is also connected to a network-on-chip (NOC) 112, which is a communication subsystem on an integrated circuit. In other embodiments, NOC 112 can be replaced by a bus.

A NOC can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. In embodiments, the wires and the links of a NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges).

Connected to and in communication with NOC 112 is processor 114, ECC engine 116, memory interface 118, and DRAM controller 120. DRAM controller 120 is used to operate and communicate with local high speed volatile memory 108 (e.g., DRAM). In other embodiments, local high speed volatile memory 108 can be SRAM or another type of volatile memory.

ECC engine 116 performs error correction services. For example, ECC engine 116 performs data encoding and decoding, as per the implemented ECC technique. In one embodiment, ECC engine 116 is an electrical circuit programmed by software. For example, ECC engine 116 can be a processor that can be programmed. In other embodiments, ECC engine 116 is a custom and dedicated hardware circuit without any software. In another embodiment, the function of ECC engine 116 is implemented by processor 114.

Processor 114 performs the various controller memory operations, such as programming, erasing, reading, as well as memory management processes. In an embodiment, processor 114 is programmed by firmware. In other embodiments, processor 114 is a custom and dedicated hardware circuit without any software. In an embodiment, processor 114 also implements a translation module, as a software/firmware process or as a dedicated hardware circuit.

In many systems, non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To enable this system, the controller (e.g., the translation module) performs address translation between the logical addresses used by the host and the physical addresses used by the memory dies.

One example implementation is to maintain tables (e.g., the L2P tables mentioned above) that identify a translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure.

In some examples, the memory space of a storage system is so large that local memory 108 cannot hold all of the L2P tables. In such a case, the entire set of L2P tables are stored in a memory die 106 and a subset of the L2P tables are cached (L2P cache) in the local high speed volatile memory 108.

In an embodiment, memory interface 118 communicates with one or more memory die 106. In an embodiment, memory interface 118 provides a Toggle Mode interface. Other interfaces also can be used. In some example implementations, memory interface 118 (or another portion of controller 104) implements a scheduler and buffer for transmitting data to and receiving data from one or more memory die.

Figure 2:
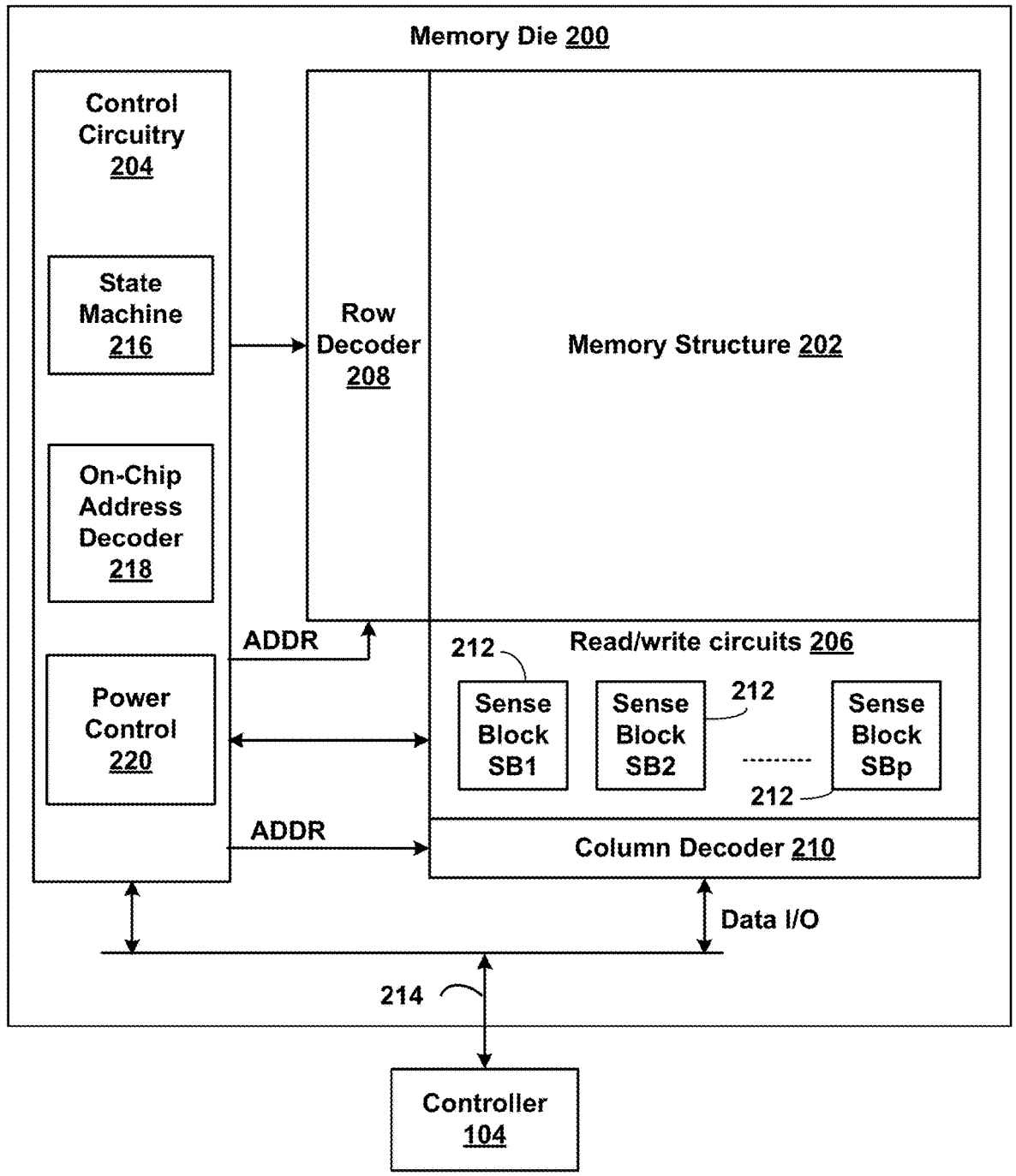
FIG. 2 is a block diagram of one embodiment of a memory die.

FIG. 2 is a functional block diagram of one embodiment of a memory die 200. Each of the one or more memory die 106 of FIG. 1 can be implemented as memory die 200 of FIG. 2. The components depicted in FIG. 2 are electrical circuits. In an embodiment, each memory die 200 includes a memory structure 202, control circuitry 204, and read/write circuits 206. Memory structure 202 is addressable by word lines via a row decoder 208 and by bit lines via a column decoder 210.

In an embodiment, read/write circuits 206 include multiple sense blocks 212 including SB1, SB2, . . . , SBp (sensing circuitry) and allow a page (or multiple pages) of data in multiple memory cells to be read or programmed (written) in parallel. In an embodiment, each sense block 212 include a sense amplifier and a set of latches connected to the bit line. The latches store data to be written and/or data that has been read. In an embodiment, each sense amplifier 212 includes bit line drivers. In an embodiment, commands and data are transferred between controller 104 and memory die 200 via lines 214. In an embodiment, memory die 200 includes a set of input and/or output (I/O) pins that connect to lines 214.

In an embodiment, control circuitry 204 cooperates with read/write circuits 206 to perform memory operations (e.g., write, read, erase, and others) on memory structure 202. In an embodiment, control circuitry 204 includes a state machine 216, an on-chip address decoder 218, and a power control circuit 220. In an embodiment, state machine 216 provides die-level control of memory operations. In an embodiment, state machine 216 is programmable by software. In other embodiments, state machine 216 does not use software and is completely implemented in hardware (e.g., electrical circuits). In some embodiments, state machine 216 can be replaced by a microcontroller or microprocessor. In an embodiment, control circuitry 204 includes buffers such as registers, ROM fuses and other storage devices for storing default values such as base voltages and other parameters.

On-chip address decoder 218 provides an address interface between addresses used by controller 104 to the hardware address used by row decoder 208 and column decoder 210. Power control module 220 controls the power and voltages supplied to the word lines and bit lines during memory operations. Power control module 220 may include charge pumps for creating voltages.

For purposes of this document, control circuitry 204, read/write circuits 206, row decoder 208 and column decoder 210 comprise a control circuit for memory structure 202. In other embodiments, other circuits that support and operate on memory structure 202 can be referred to as a control circuit. For example, in some embodiments, controller 104 can operate as the control circuit or can be part of the control circuit. The control circuit also can be implemented as a microprocessor or other type of processor that is hardwired or programmed to perform the functions described herein.

For purposes of this document, control circuitry 204, read/write circuits 206, row decoder 208 and column decoder 210 comprise peripheral circuits for memory structure 202, as they are not part of memory structure 202 but are on the same die as memory structure 202 and are used to operate memory structure 202.

In an embodiment, memory structure 202 is a three dimensional memory array of non-volatile memory cells. In an embodiment, memory structure 202 is a monolithic three dimensional memory array in which multiple memory levels are formed above a single substrate, such as a wafer. The memory structure may be any type of non-volatile memory that is formed in one or more physical levels of arrays of memory cells having an active area disposed above a silicon (or other type of) substrate. In one example, the non-volatile memory cells of memory structure 202 include vertical NAND strings with charge-trapping material such as described. A NAND string includes memory cells connected by a channel.

In another embodiment, memory structure 202 includes a two dimensional memory array of non-volatile memory cells. In an example, the non-volatile memory cells are NAND flash memory cells utilizing floating gates. Other types of memory cells (e.g., NOR-type flash memory) also can be used.

The exact type of memory array architecture or memory cell included in memory structure 202 is not limited to the examples above. Many different types of memory array architectures or memory cell technologies can be used to form memory structure 202. No particular non-volatile memory technology is required for purposes of the new technology described herein.

Other examples of suitable technologies for memory cells of the memory structure 202 include ReRAM memories, magnetoresistive memory (MRAM), phase change memory (PCM), and the like. Examples of suitable technologies for architectures of memory structure 202 include two dimensional arrays, three dimensional arrays, cross-point arrays, stacked two dimensional arrays, vertical bit line arrays, and the like.

One example of a cross point memory includes reversible resistance-switching elements arranged in cross point arrays accessed by X lines and Y lines (e.g., word lines and bit lines). In another embodiment, the memory cells may include conductive bridge memory elements. A conductive bridge memory element also may be referred to as a programmable metallization cell.

A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of solid electrolyte between the two electrodes.

MRAM stores data using magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—$Sb_2Te_3$ super lattice to achieve non-thermal phase changes by simply changing the coordination state of Germanium atoms with a laser pulse (or light pulse from another source). Therefore, the doses of programming are laser pulses. The memory cells can be inhibited from programming by blocking the memory cells from receiving the light.

A person of ordinary skill in the art will recognize that the technology described herein is not limited to a single specific memory structure, but covers many relevant memory structures within the scope of the technology as described herein and as understood by one of ordinary skill in the art.

Figure 3:
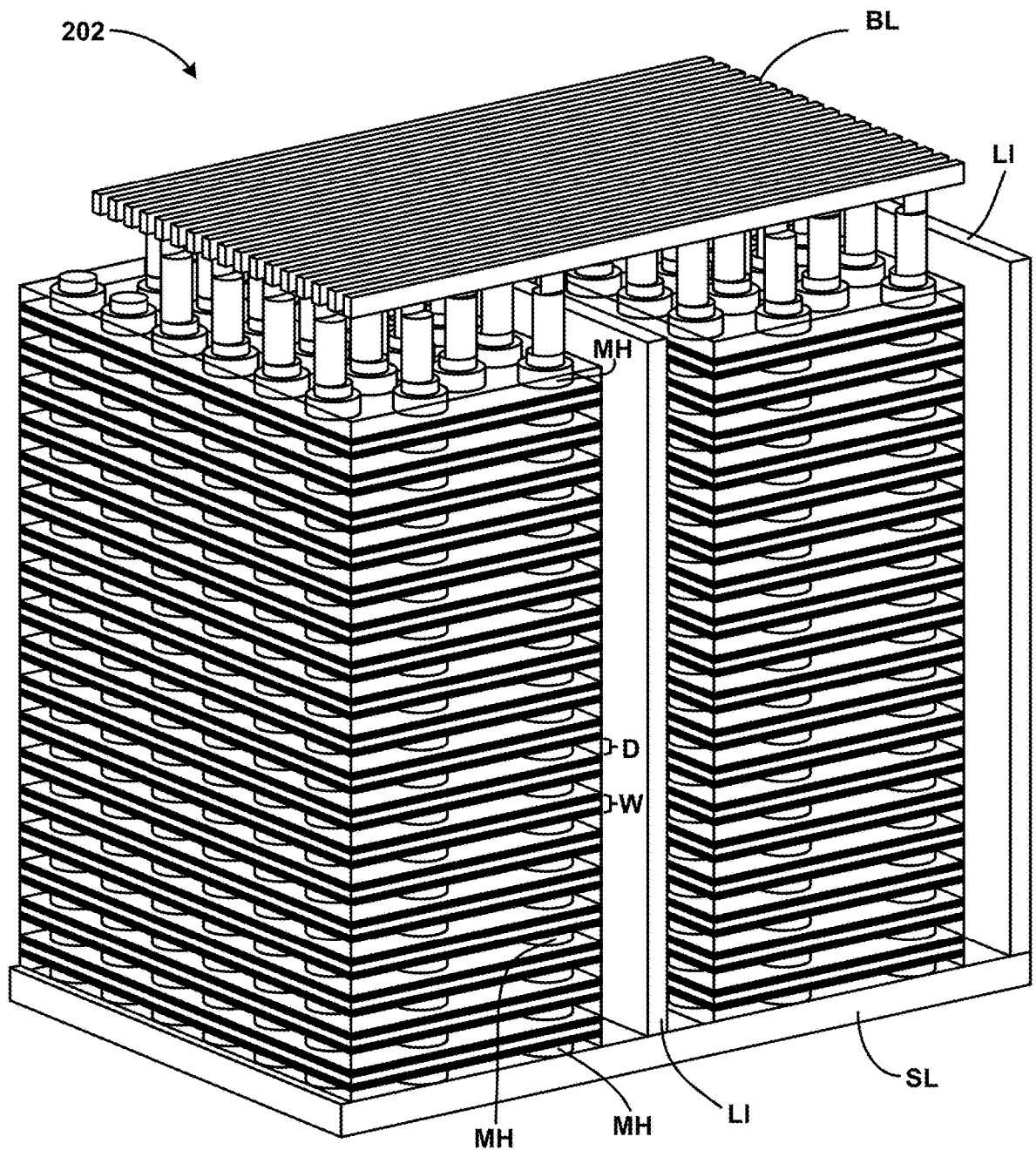
FIG. 3 is a perspective view of a portion of one embodiment of a three dimensional memory structure.

FIG. 3 is a perspective view of a portion of an embodiment of a three dimensional memory array that includes memory structure 202. In an embodiment, memory structure 202 includes multiple non-volatile memory cells. For example, FIG. 3 shows a portion of one block of memory cells. The structure depicted includes a set of bit lines BL positioned above a stack of alternating dielectric layers and conductive layers. For example purposes, one of the dielectric layers is marked as D and one of the conductive layers (also called word line layers) is marked as W.

The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers also can be used. In an embodiment, the alternating dielectric layers and conductive layers are divided into four regions by local interconnects LI. FIG. 3 shows two regions and two local interconnects LI.

A source line layer SL is below the alternating dielectric layers and word line layers. Memory holes are formed in the stack of alternating dielectric layers and conductive layers. For example, one of the memory holes is marked as MH. Note that in FIG. 3 the dielectric layers are depicted as see-through so that the reader can see the memory holes positioned in the stack of alternating dielectric layers and conductive layers.

In an embodiment, NAND strings are formed by filling the memory hole with materials including a charge-trapping material to create a vertical column of memory cells (also referred to as a memory column). In an embodiment, each memory cell can store one or more bits of data. In an embodiment, each memory hole MH is associated with and coupled to a corresponding one of bit lines BL. In an embodiment, each bit line BL is coupled to one or more memory holes MH. More details of a three dimensional memory array that comprises memory structure 202 is provided below with respect to FIG. 4A-4F.

Figure 4A:
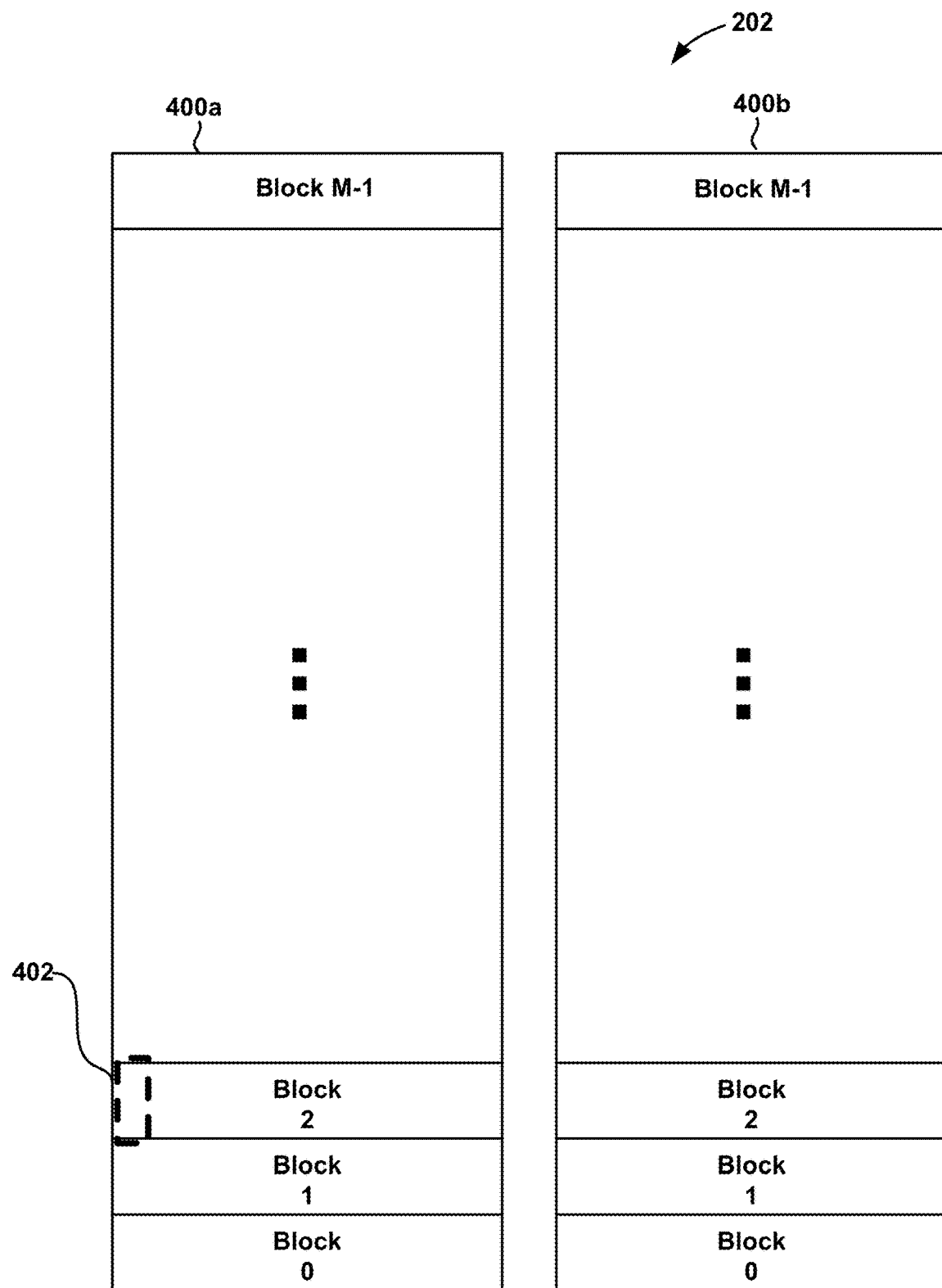
FIG. 4A is a block diagram of a memory structure having two planes.

FIG. 4A is a block diagram explaining one example organization of memory structure 202, which is divided into two planes 400*a* and 400*b*. Both planes are on the same memory die 200 (FIG. 2). Each plane is then divided into M blocks. In one example, each plane has about 2000 blocks. However, different numbers of blocks and planes also can be used. A portion 402 of block 2 of memory plane 400*a* is shown in dashed line in FIG. 4A.

In an embodiment, a block of memory cells is a unit of erase. That is, all memory cells of a block are erased together. In other embodiments, memory cells can be grouped into blocks for other reasons, such as to organize memory structure 202 to enable the signaling and selection circuits. In some embodiments, a block represents a group of connected memory cells as the memory cells of a block share a common set of word lines. Although FIG. 4A shows two planes on the same die, in other embodiments more than two planes can be implemented. For example, memory structure 202 can include 2-8 (or more) planes.

Figure 4B:
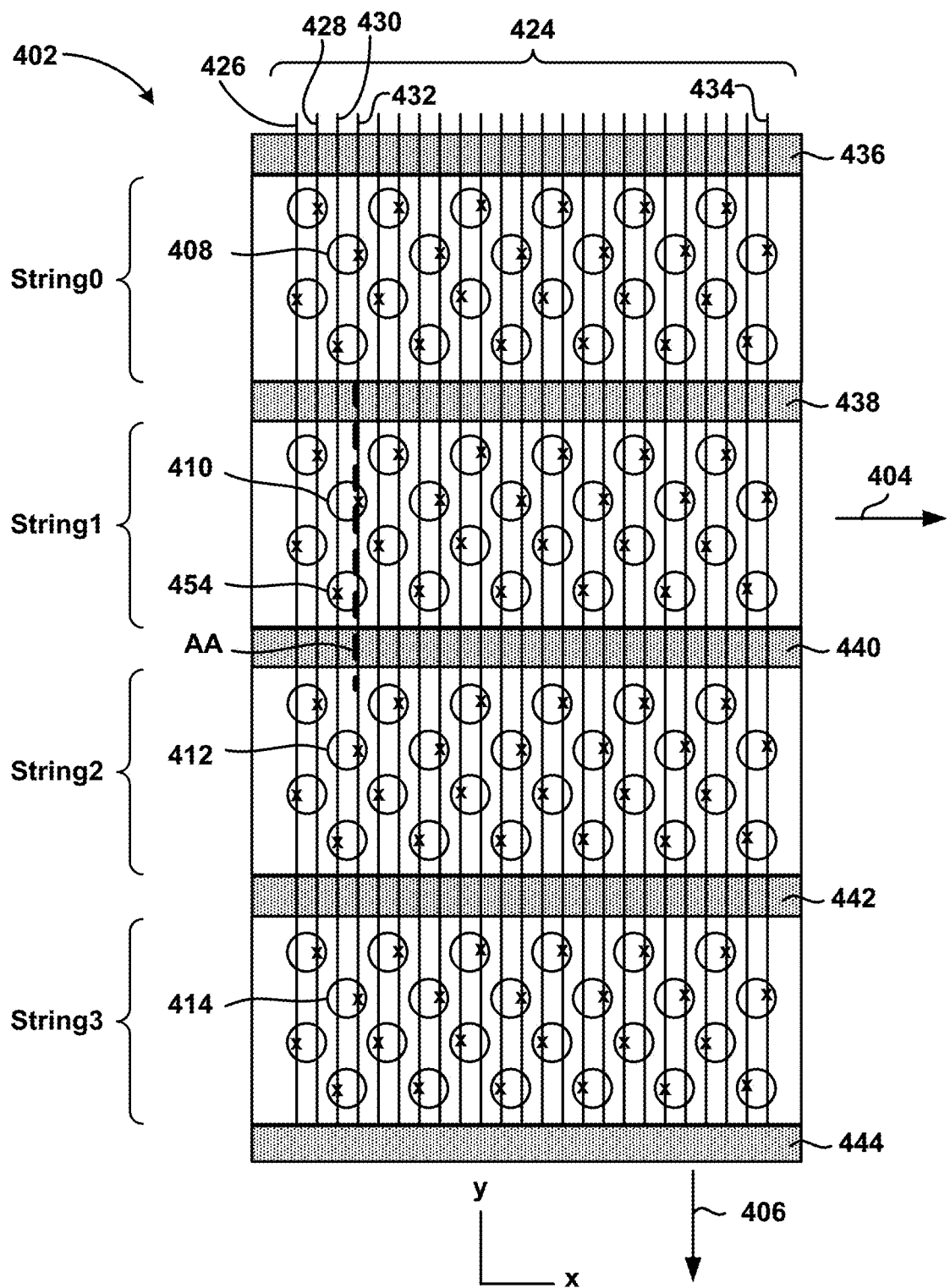
FIG. 4B depicts a top view of a portion of a block of memory cells.

FIGS. 4B-4F depict an example three dimensional ("3D") NAND structure that corresponds to the structure of FIG. 3. FIG. 4B is a block diagram depicting a top view of portion 402 (FIG. 4A) of memory structure 202. As can be seen from FIG. 4B, portion 402 extends in direction 404 and direction 406. In an embodiment, the memory array has many layers, however, FIG. 4B only shows the top layer.

FIG. 4B depicts a plurality of circles that represent the memory holes, which are also referred to as memory columns. For example, FIG. 4B depicts memory holes 408, 410, 412 and 414. Each of the memory holes include multiple select transistors (also referred to as a select gate or selection gate) and multiple memory cells. In an embodiment, each memory hole implements a NAND string. Because portion 402 extends in directions 404 and 406, the block includes more memory holes than depicted in FIG. 4B.

FIG. 4B also depicts a set of bit lines 424, including bit lines 426, 428, 430, 432, . . . 434. In an embodiment, each memory hole is associated with and coupled to a corresponding one of the bit lines. In an embodiment, each bit line is coupled to one or more memory holes. FIG. 4B shows twenty four bit lines because only a portion of the block is depicted. It is contemplated that more than twenty four bit lines are connected to memory holes of the block. Each of the circles representing a memory hole has an "x" to indicate its connection to one bit line. For example, bit line 432 is connected to memory holes 408, 410, 412 and 414.

Portion 402 depicted in FIG. 4B includes a set of local interconnects 436, 438, 440, 442 and 444 that connect the various layers to a source line below the memory holes. Local interconnects 436, 438, 440, 442 and 444 also serve to divide each layer of the block into four regions. For example, the top layer depicted in FIG. 4B is divided into four regions designated as String0, String1, String2 and String3. In the layers of the block that implement memory cells, String0, String1, String2 and String3 also may be referred to as word line fingers that are separated by the local interconnects.

In an embodiment, the word line fingers on a common level of a block connect together to form a single word line. In another embodiment, the word line fingers on the same level are not connected together. In an example implementation, a bit line connects to a single memory hole in each of String0, String1, String2 and String3. In that implementation, each block has sixteen rows of active columns and each bit line connects to four rows in each block.

In an embodiment, all four rows connected to a common bit line are connected to the same word line (via different word line fingers on the same level that are connected together). Therefore, the system uses the source side selection lines and the drain side selection lines to choose one (or another subset) of the four to be subjected to a memory operation (program, verify, read, and/or erase).

Although FIG. 4B shows four regions String0, String1, String2 and String3, each having four rows of memory holes, and sixteen rows of memory holes in a block, those exact numbers are an example implementation. Other embodiments may include more or less regions per block, more or less rows of memory holes per region and more or less rows of memory holes per block. FIG. 4B also shows the memory holes being staggered. In other embodiments, different patterns of staggering can be used. In some embodiments, the memory holes are not staggered.

Figure 4C:
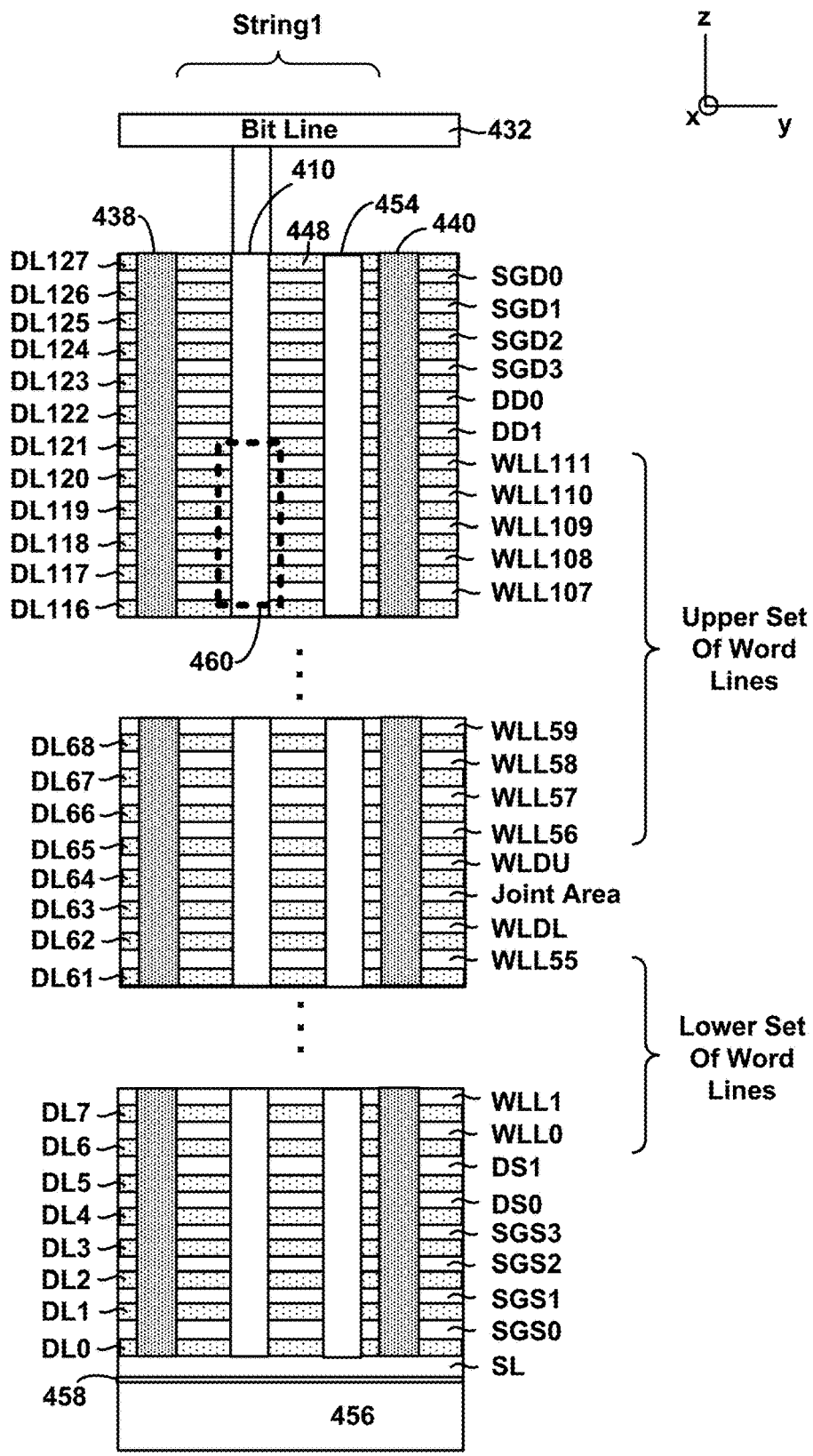
FIG. 4C depicts a cross sectional view of a portion of a block of memory cells.

FIG. 4C depicts a portion of one embodiment of a three dimensional memory structure 202 showing a cross-sectional view along line AA of FIG. 4B. This cross sectional view cuts through memory holes 410 and 454 of String1 (see FIG. 4B). The structure of FIG. 4C includes four drain side select layers SGD0, SGD1, SGD2 and SGD3, four source side select layers SGS0, SGS1, SGS2 and SGS3, six dummy word line layers DD0, DD1, DS0, DS1, WLDL, WLDU, and one hundred and twelve data word line layers WLL0-WLL111 for connecting to memory cells. Other embodiments can implement more or less than four drain side select layers, more or less than four source side select layers, more or less than six dummy word line layers, and more or less than one hundred and twelve word lines.

Memory holes 410 and 454 are depicted protruding through the drain side select layers, source side select layers, dummy word line layers and word line layers. In one embodiment, each memory hole includes a vertical NAND string. Below the memory holes and the layers listed below is substrate 456, an insulating film 458 on the substrate, and source line SL. The NAND string of memory hole 410 has a source end at a bottom of the stack and a drain end at a top of the stack. As in agreement with FIG. 4B, FIG. 4C shows memory hole 410 connected to bit line 432 via connector 460. Local interconnects 438 and 440 also are depicted.

For ease of reference, drain side select layers SGD0, SGD1, SGD2 and SGD3, source side select layers SGS0, SGS1, SGS2 and SGS3, dummy word line layers DD0, DD1, DS0, DS1, WLDL and WLDU, and word line layers WLL0-WLL111 collectively are referred to as the conductive layers. In an embodiment, the conductive layers are made from a combination of TiN and tungsten. In other embodiments, other materials can be used to form the conductive layers, such as doped polysilicon, metal such as tungsten or metal silicide. In some embodiments, different conductive layers can be formed from different materials.

Between conductive layers are dielectric layers DL0-DL127. For example, dielectric layer DL120 is above word line layer WLL110 and below word line layer WLL111. In an embodiment, the dielectric layers are made from $SiO_2$. In other embodiments, other dielectric materials can be used to form the dielectric layers.

The non-volatile memory cells are formed along memory holes which extend through alternating conductive and dielectric layers in the stack. In an embodiment, the memory cells are arranged in NAND strings. The word line layers WLL0-WLL111 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data.

In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a "Joint Area." In an embodiment it is expensive and/or challenging to etch one hundred and twelve word line layers intermixed with dielectric layers. To ease this burden, one embodiment includes laying down a first stack of fifty-six word line layers alternating with dielectric layers, laying down the Joint Area, and laying down a second stack of fifty-six word line layers alternating with dielectric layers. The Joint Area is positioned between the first stack and the second stack. The Joint Area is used to connect the first stack to the second stack.

In FIG. 4C, the first stack is labeled as the "Lower Set of Word Lines" and the second stack is labeled as the "Upper Set of Word Lines." In an embodiment, the Joint Area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
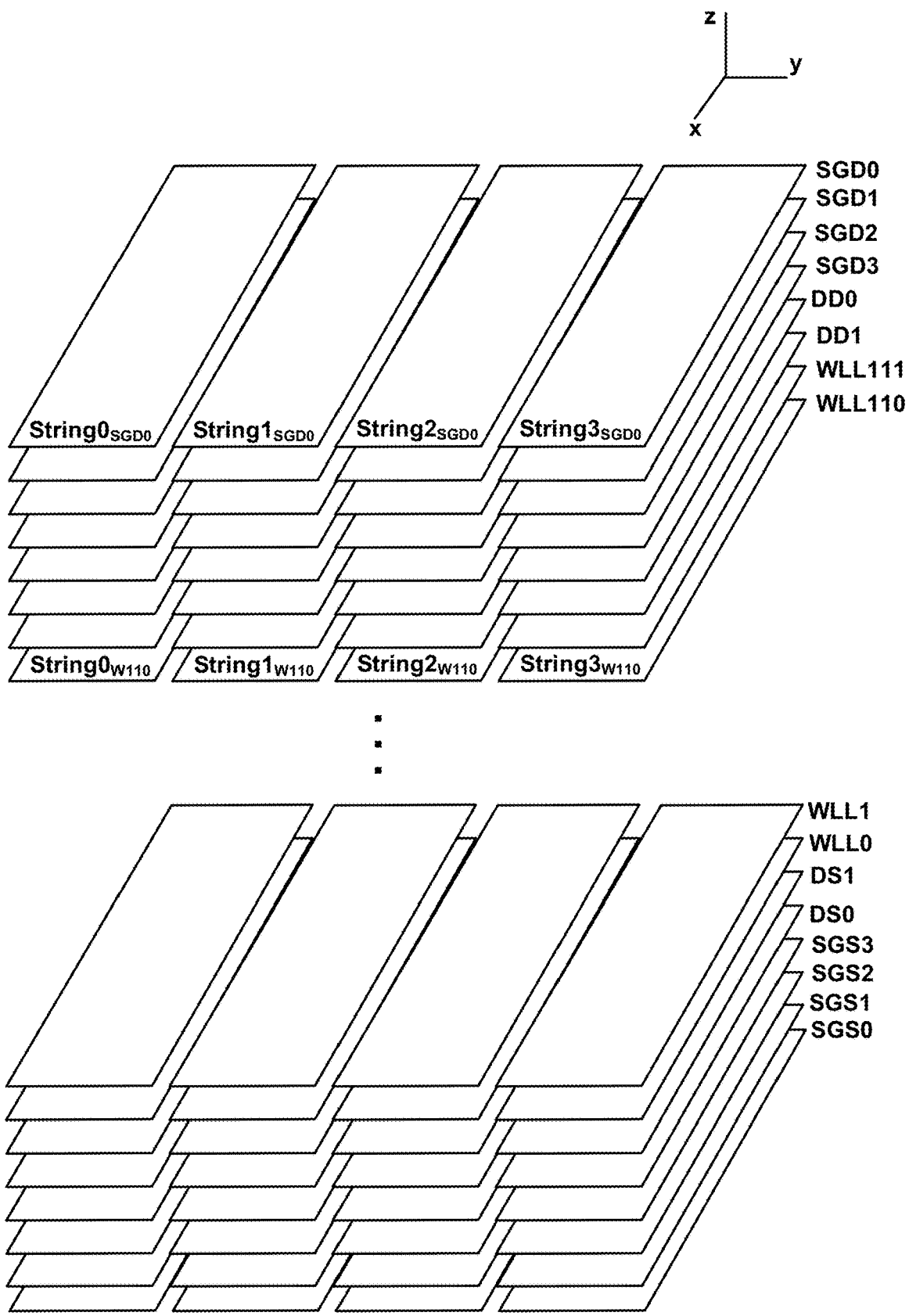
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL111) for the block that is partially depicted in FIG. 4C. As mentioned above with respect to FIG. 4B, in an embodiment local interconnects 436, 438, 440, 442 and 444 break up the conductive layers into four regions/fingers.

For example, word line layer WLL110 is divided into regions String0$_{W110}$, String1$_{W110}$, String2$_{W110}$ and String3$_{W110}$. In an embodiment, the four word line fingers on a same level are connected together. In another embodiment, each word line finger operates as a separate word line.

Likewise, drain side select gate layer SGD0 (the top layer) is divided into regions Strin0$_{SGD0}$, String1$_{SGD0}$, String2$_{SGD0}$ and String3$_{SGD0}$, also known as fingers or select line fingers. In an embodiment, the four select line fingers on a same level are connected together. In another embodiment, each select line finger operates as a separate word line.

Figure 4E:
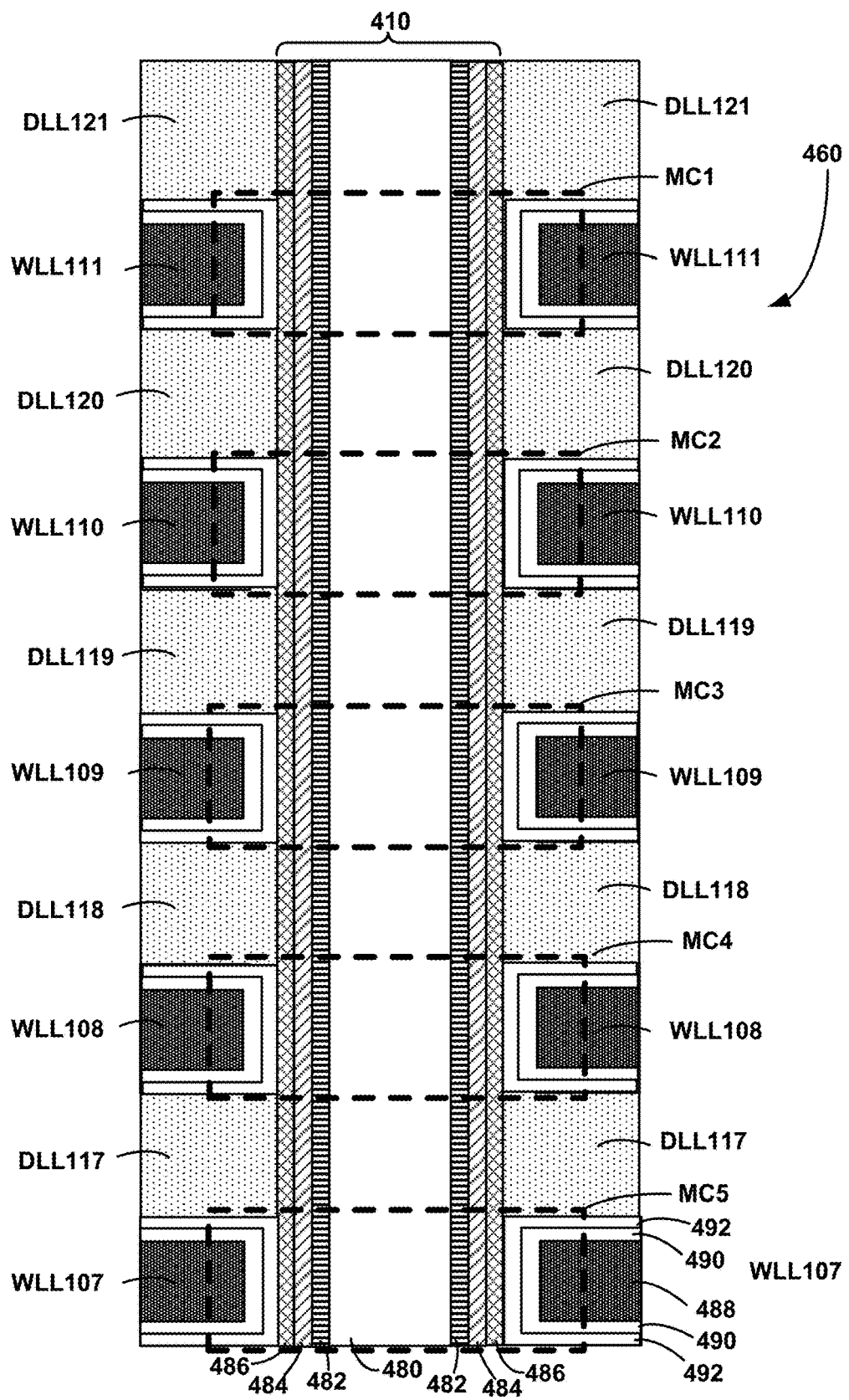
FIG. 4E is a cross sectional view of a memory hole of memory cells.

FIG. 4E depicts a cross sectional view of String1 of FIG. 4C that includes a portion of memory hole 410. In an embodiment, the memory holes (e.g., memory hole 410) are shaped as cylinders. In other embodiment, however, memory holes may have other shapes. In an embodiment, memory hole 410 includes an inner core layer 480, a channel 482 surrounding inner core layer 480, a tunneling dielectric 484 surrounding channel 482, and a charge trapping layer 486 surrounding tunneling dielectric 484. In an embodiment, inner core layer 480 a dielectric material (e.g., $SiO_2$), channel 482 is polysilicon, tunneling dielectric 484 has an ONO structure, and charge trapping layer 486 is silicon nitride. Other memory materials and structures can also be used. The technology described herein is not limited to any particular material or structure.

FIG. 4E depicts dielectric layers DLL121, DLL120, DLL119, DLL118 and DLL117, as well as word line layers WLL107, WLL108, WLL109, WLL110, and WLL111. In an embodiment, each of the word line layers includes a word line region 488 surrounded by an aluminum oxide layer 490, which is surrounded by a blocking oxide ($SiO_2$) layer 492. The physical interaction of the word line layers with the memory hole forms the memory cells. Thus, a memory cell, in an embodiment, includes channel 482, tunneling dielectric 484, charge trapping layer 486, blocking oxide layer 492, aluminum oxide layer 490 and word line region 488.

For example, word line layer WLL111 and a portion of memory hole 410 comprise a memory cell MC1. Word line layer WLL110 and a portion of memory hole 410 comprise a memory cell MC2. Word line layer WLL109 and a portion of memory hole 410 comprise a memory cell MC3. Word line layer WLL108 and a portion of memory hole 410 comprise a memory cell MC4. Word line layer WLL107 and a portion of memory hole 410 comprise a memory cell MC5. In other architectures, a memory cell may have a different structure; however, the memory cell would still be the storage unit.

In an embodiment, when a memory cell is programmed, electrons are stored in a portion of the charge trapping layer 486 which is associated with the memory cell. These electrons are drawn into the charge trapping layer 486 from the channel 482, through the tunneling dielectric 484, in response to an appropriate voltage on word line region 488. The threshold voltage (Vth) of a memory cell is increased in proportion to the amount of stored charge.

In an embodiment, programming a memory cell is achieved through Fowler-Nordheim tunneling of the electrons into charge trapping layer 486. During an erase operation, the electrons return to channel 482 or holes are injected into charge trapping layer 486 to recombine with electrons. In an embodiment, erasing is achieved using hole injection into charge trapping layer 486 via a physical mechanism such as gate induced drain leakage (GIDL).

Figure 4F:
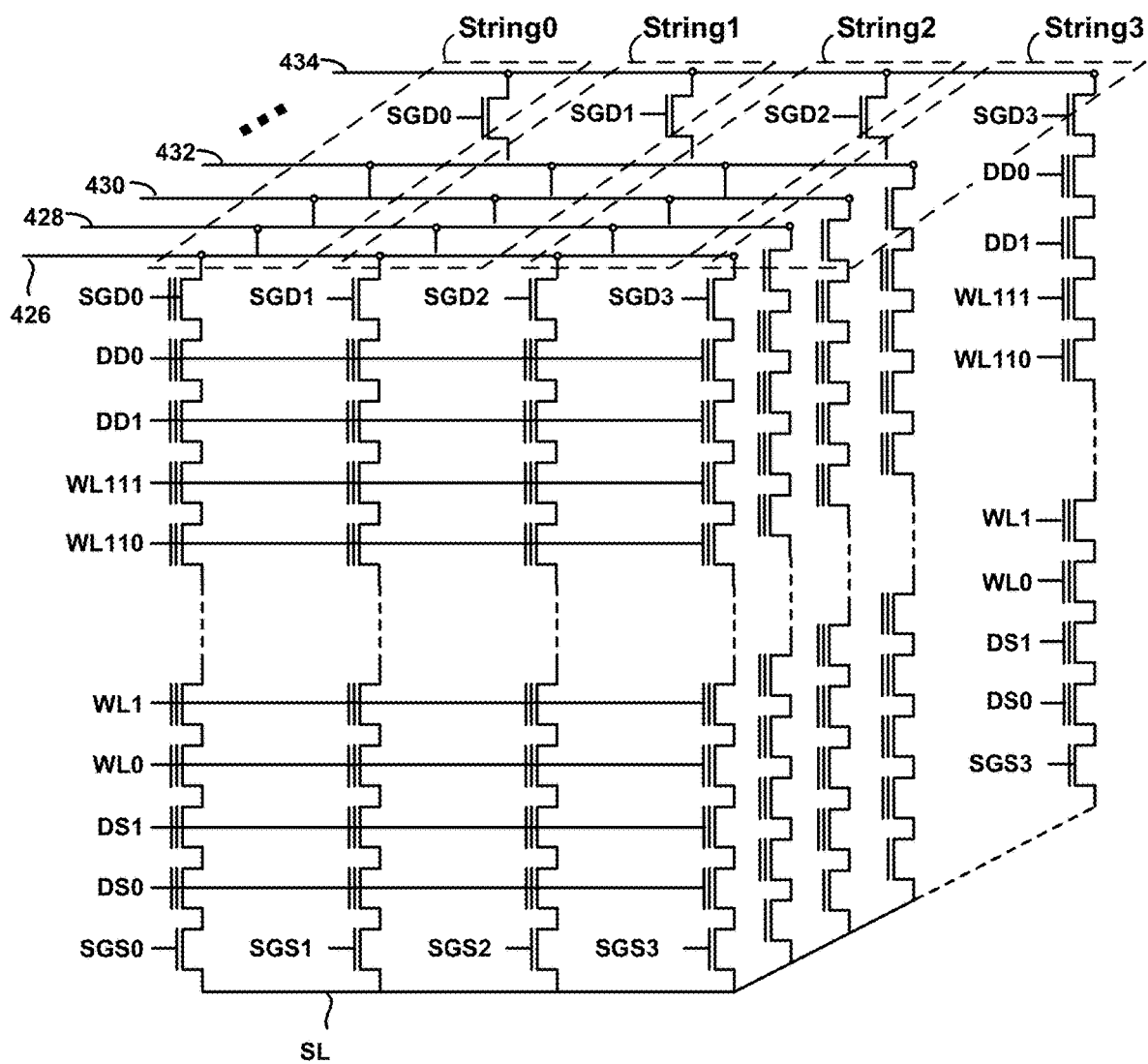
FIG. 4F is a schematic of a plurality of NAND strings.

FIG. 4F is a schematic diagram of corresponding to portion 402 in Block 2 of FIGS. 4A-E, including bit lines 426, 428, 430, 432, . . . 434, and word lines WLL0-WLL111. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line.

During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

During a memory operation some word lines are referred to as selected word lines because they are connected to selected memory cells. Unselected word lines are not connected to selected memory cells. Similarly, selected bit lines are connected to selected memory cells and unselected bit lines are not connected to selected memory cells.

Although the example memory system of FIG. 3 and FIGS. 4A-4F is a three dimensional memory structure that includes vertical NAND strings with charge-trapping material, other (2D and 3D) memory structures also can be used with the technology described herein.

Figures 5, 6:
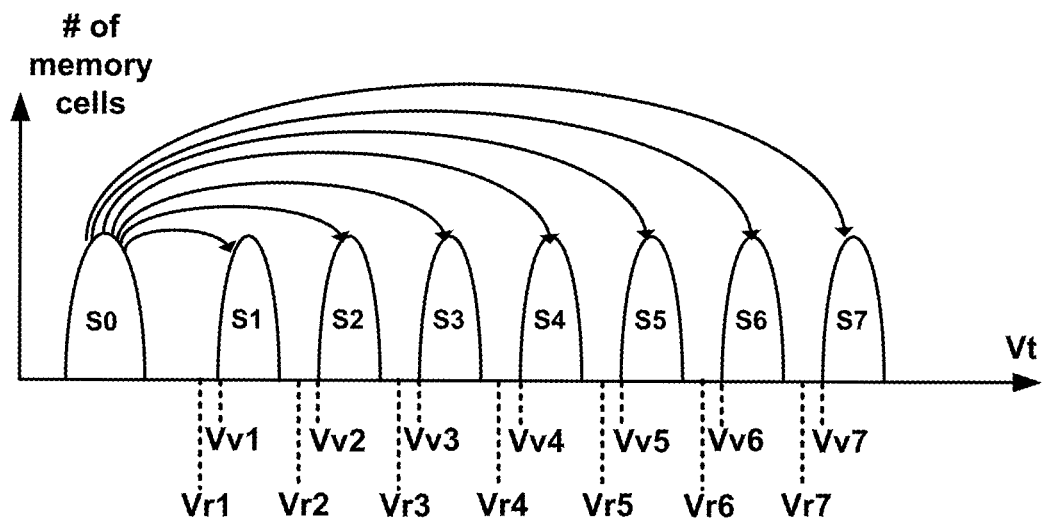
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for a memory array when each memory cell stores three bits of data. Other embodiments, however, may use other data capacities per memory cell (e.g., such as one, two, four, or five bits of data per memory cell).

FIG. 5 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states.

Each threshold voltage distribution (data state) corresponds to predetermined values for the set of data bits. The specific relationship between the data programmed into a memory cell and the threshold voltage levels of the memory cell depends on the data encoding scheme adopted for the cells. In an embodiment, data values are assigned to the threshold voltage ranges using a Gray code assignment so that if the threshold voltage of a memory cell erroneously shifts to its neighboring physical state, only one bit will be affected.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (S0, S1, S2, S3, . . . , S7) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In an embodiment, known as full sequence programming, memory cells can be programmed from the erased data state S0 directly to any of the programmed states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent full sequence programming.

The technology described herein also can be used with other types of programming in addition to full sequence programming (including, but not limited to, multiple stage/phase programming). In some embodiments, programmed states S1-S7 can overlap, with controller 104 (FIG. 1) relying on error correction to identify the correct data being stored.

FIG. 6 is a table describing an example assignment of data values to data states. In the table of FIG. 6, S0=111, S1=110, S2=100, S3=000, S4=010, S5=011, S6=001 and S7=101. Other encodings of data also can be used. No particular data encoding is required by the technology disclosed herein. In an embodiment, when a block is subjected to an erase operation, all memory cells are moved to data state S0, the erased state. In the embodiment of FIG. 6, all bits stored in a memory cell are "1" when the memory cell is erased (e.g., in data state S0).

Figures 7A, 7B, 7C, 7D, 7E:
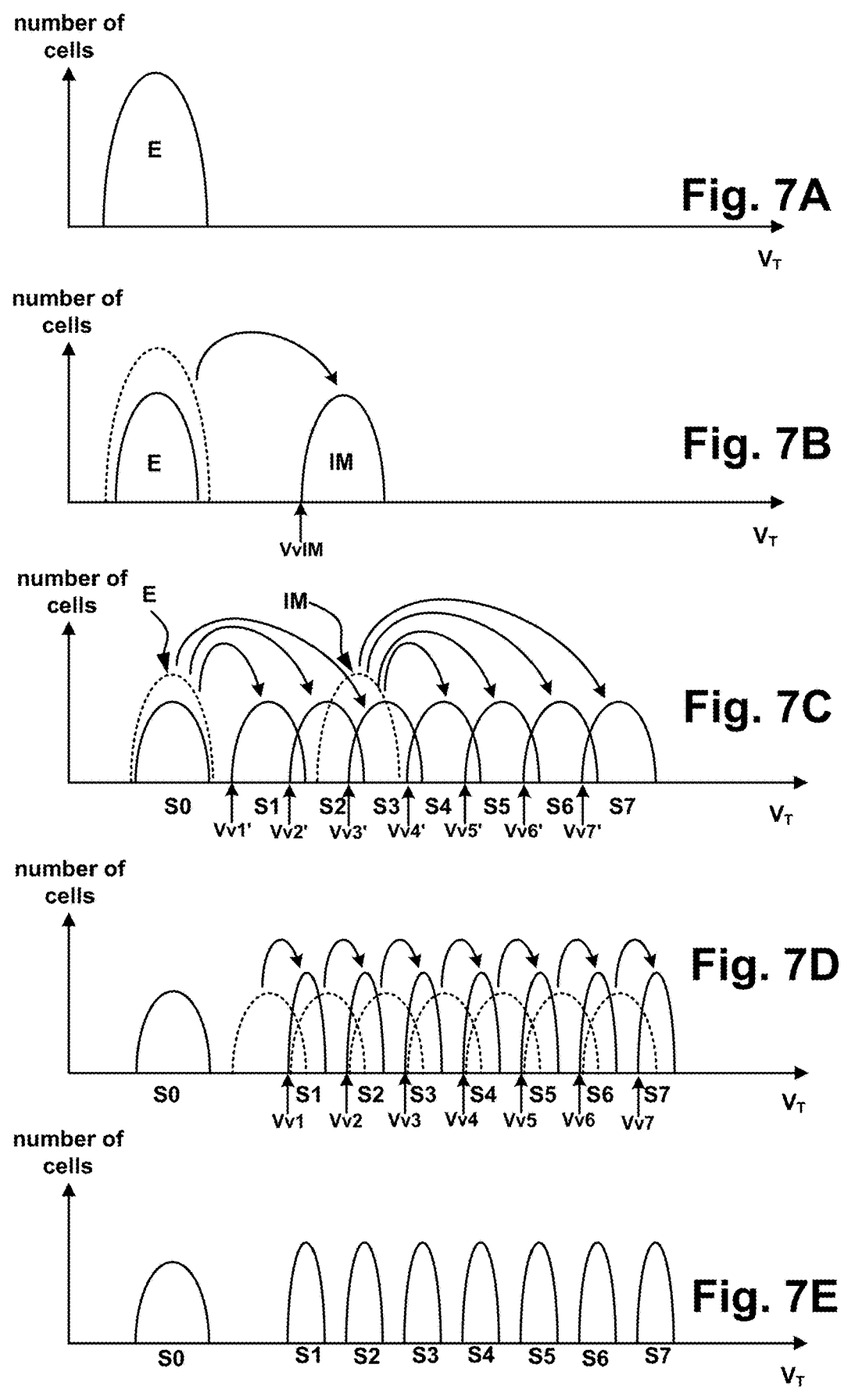

FIGS. 7A-7E illustrate a multi-phase programming approach. In this embodiment, the programming process includes three phases. Prior to programming, the memory cells are erased so that all memory cells connected to a common word line are in an erased threshold voltage distribution E, as depicted in FIG. 7A.

During the first programming phase, those memory cells whose targets (due to the data to be stored in those memory cells) are data states S4, S5, S6 or S7 are programmed to an intermediate threshold voltage distribution IM. Those memory cells are targeted for data states S0, S1, S2 or S3 remain in the erased threshold voltage distribution E. The first phase is graphically depicted in FIG. 7B. Memory cells being programmed to intermediate threshold voltage distribution IM are programmed to a target threshold voltage of VvIM.

During the second programming phase, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0.

Also, during the second programming phase, those memory cells that are in the intermediate state threshold voltage distribution IM are programmed to their target data states. For example, those memory cells to be programmed to data state S7 are programmed from intermediate threshold voltage distribution IM to data state S7, those memory cells to be programmed to data state S6 are programmed from intermediate threshold voltage distribution IM to data state S6, those memory cells to be programmed to data state S5 are programmed from intermediate threshold voltage distribution IM to data state S5, and those memory cells to be in data state S4 are programmed from intermediate threshold voltage distribution IM to data state S4. This second programming phase is illustrated in FIG. 7C.

As can be seen in FIG. 7C, at the end of the second programming phase data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

In the third programming phase, each of data states S1-S7 are tightened so that they no longer overlap with neighboring states. This is depicted graphically by FIG. 7D. The final result of the three phrase programming process is depicted in FIG. 7E, which shows data states S0-S7. In some embodiments, data state S0 is wider than data states S1-S7. In an embodiment, the data states of FIGS. 7A-7E may be encoded according to the table of FIG. 6.

In some embodiments, those memory cells to be programmed to data state S4 are not programmed during the second phase and, therefore, remain in intermediate threshold voltage distribution IM. During the third programming phase, the memory cells are programmed from intermediate threshold voltage distribution IM to S4. In other embodiments, memory cells destined for other states can also remain in intermediate threshold voltage distribution IM or erase threshold voltage distribution E during the second phase.

Figure 8:
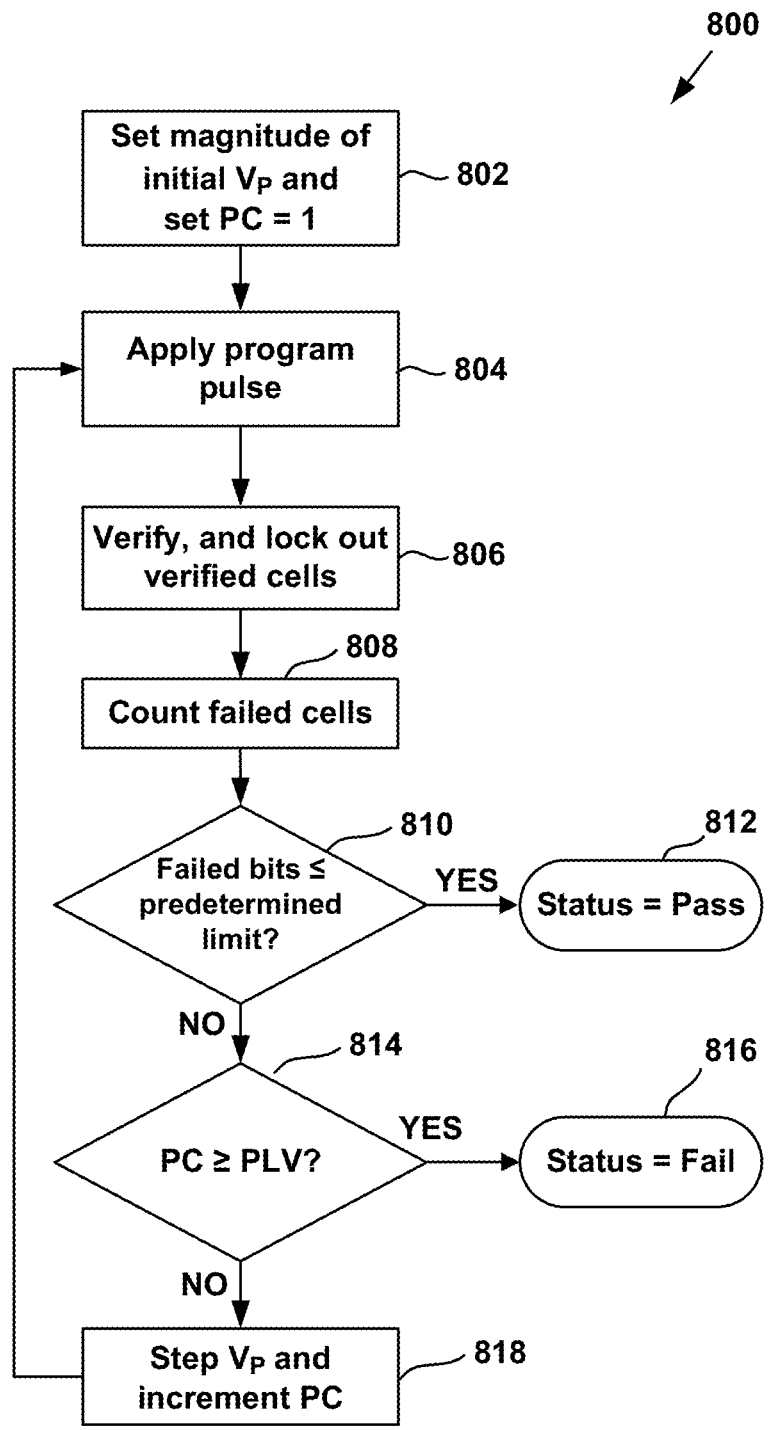
FIG. 8 is a flowchart describing an embodiment of a process for programming non-volatile memory.

FIG. 8 is a flowchart describing an embodiment of a process 800 for programming a memory cell. In an example embodiment, process 800 is performed on memory die 106 (FIG. 1) using the control circuits discussed above. For example, process 800 can be performed at the direction of state machine 216 (FIG. 2). Process 800 also can be used to implement the full sequence programming discussed above. Additionally, process 800 can be used to implement each phase of a multi-phase programming process.

Typically, a program voltage is applied to the control gates (via a selected word line) during a program operation as a series of program pulses. Between programming pulses are a set of verify pulses to perform verification. In many implementations, the magnitude of the program pulses increase with each successive program pulse by a predetermined program step size. This programming technique is sometimes called incremental step pulse programming (ISPP).

In step 802 of process 800, a programming voltage ($V_P$) is initialized to a starting program voltage $V_{Pinit}$ (e.g., between about 12V to about 16V, or some other value) and a program counter PC maintained by state machine 216 is initialized at 1.

In step 804, a program pulse having a magnitude $V_P$ is applied to the selected word line (the word line selected for programming). In an embodiment, the group of memory cells being concurrently programmed are all connected to the same word line (the selected word line). If a memory cell is to be programmed, then the corresponding bit line coupled to the memory cell is grounded. If a memory cell should remain at its current threshold voltage, then the corresponding bit line coupled to the memory cell is connected to Vdd to inhibit programming. In an embodiment, the unselected word lines receive one or more boosting voltages (e.g., between about 7V to about 11V, or some other value) to perform boosting schemes known in the art.

In step 804, the program pulse is applied to all memory cells connected to the selected word line so that all of the connected memory cells are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 806, the memory cells are verified using the appropriate set of verify reference voltages to perform one or more verify operations. In an embodiment, the verification process is performed by testing whether the threshold voltages of the memory cells selected for programming have reached the appropriate verify reference voltage.

In step 808, the memory system counts the number of memory cells that have not yet reached their respective target threshold voltage distribution. That is, the system counts the number of memory cells that have so far failed the verify process. This counting can be done by state machine 216 (FIG. 2), controller 104 (FIG. 1), or other logic. In the remaining discussion, the term "Controller Device" may be one or more of controller 104 of FIG. 1, control circuitry 204 of FIG. 2, state machine 216 of FIG. 2, or other similar controller device.

In an embodiment, each of sense blocks 212 (FIG. 2) stores the status (pass/fail) of their respective memory cells. In an embodiment, one total count reflects the total number of memory cells currently being programmed that have failed the last verify step. In another embodiment, separate counts are kept for each data state.

In step 810, a determination is made whether the count from step 808 is less than or equal to a predetermined limit. In an embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 812. In this situation, enough memory cells programmed correctly such that the few remaining memory cells that have not been completely programmed can be corrected using ECC during the read process.

In some embodiments, the predetermined limit used in step 810 is below the number of bits that can be corrected by error correction codes (ECC) during a read process to allow for future/additional errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, the limit changes based on the number of errors already counted for the page, the number of program-erase cycles performed or other criteria.

If the number of failed memory cells is not less than the predetermined limit, then the programming process continues at step 814 and the program counter PC is checked against a program limit value (PLV). Examples of program limit values include 6, 12, 16, 20 and 30, although other values can be used. If the program counter PC is greater than or equal to program limit value PLV, then the program process is considered to have failed and a status of FAIL is reported in step 816.

If the program counter PC is not greater than or equal to program limit value PLV, then the process continues at step 820 in which the Program Counter PC is incremented by 1 and program voltage $V_P$ is stepped up to the next magnitude. For example, the next program pulse will have a magnitude greater than the previous pulse by a program step size $\Delta V_P$ (e.g., a step size of between about 0.1V to about 1.0V, or some other value). The process loops back to step 804 and another program pulse is applied to the selected word line so that another iteration (steps 804-818) of programming process 800 is performed. Each pass through steps 804-818 is referred to herein as a "program loop."

In general, during verify operations and read operations, the selected word line is connected to a voltage (one example of a reference signal), a level of which is specified for each read operation (e.g., read compare levels Vr1, Vr2, Vr3, Vr4, Vr5, Vr6, and Vr7, of FIG. 5) or verify operation (e.g. verify target levels Vv1, Vv2, Vv3, Vv4, Vv5, Vv6, and Vv7 of FIG. 5) to determine whether a threshold voltage of the selected memory cell has reached such level.

In an embodiment, after an appropriate read or verify voltage is applied to a selected word line, a conduction current of the memory cell is measured to determine whether the memory cell turned ON (conducts current) in response to the voltage applied to the word line. If the conduction current is measured to be greater than a certain value, then it is assumed that the memory cell turned ON and the voltage applied to the word line is greater than the threshold voltage of the memory cell.

If the conduction current is measured to be not greater than the certain value, then the memory cell did not turn ON, and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate at which the memory cell discharges or charges a dedicated capacitor in a sense amplifier. In another example, the conduction current of the selected memory cell allows (or fails to allow) the NAND string that includes the memory cell to discharge a corresponding bit line. The voltage on the bit line is measured after a period of time to see whether or not the bit line has been discharged. Note that the technology described herein can be used with different methods known in the art for verifying/reading. Other read and verify techniques known in the art also can be used.

As described above, at step 804 a program pulse is applied to the selected word line, and at step 806 memory cells coupled to the selected word line are verified using an appropriate set of verify reference voltages to perform one or more verify operations. Steps 804 and 806 are part of an iterative loop in which program pulses are applied as a series of program pulses that step up in magnitude, with intervening verify reference pulses between consecutive program pulses. Such an iterative loop is referred to herein as a "program-verify iteration."

Figure 9:
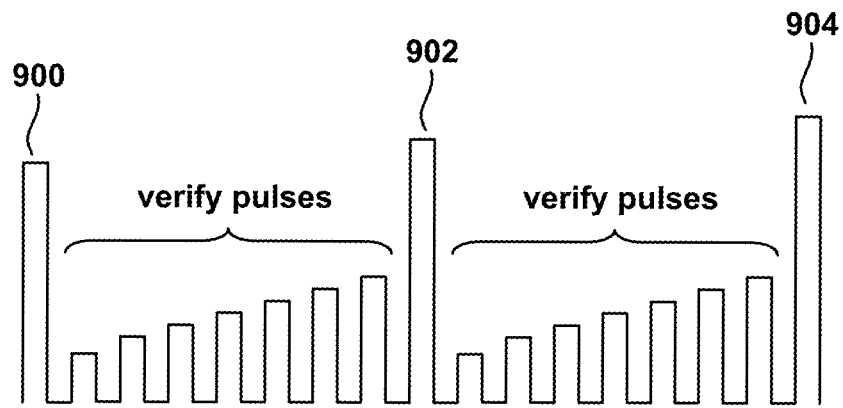
FIG. 9 depicts a word line voltage during programming and verify operations.

FIG. 9 illustrates an example of such program-verify pulses applied to a selected word line. In particular, FIG. 9 depicts program pulses 900, 902 and 904 applied to the selected word line during three successive iterations of step 804 of FIG. 8. Between program pulses 900, 902 and 904 verify pulses are applied to the selected word line during three successive program-verify iterations of steps 804-806 of FIG. 8 to determine whether threshold voltages of the memory cells are greater than the respective verify reference voltages.

FIG. 9 shows a verify pulse for each of the programmed states S1-S7 between each of program pulses 900, 902 and 904. These verify pulses consume a significant portion of a program operation. As the number of programmed states stored per memory cell increases, this situation becomes worse, limiting programming speed. FIG. 9 corresponds to memory cells that store 3-bits per cell and require 7 verify levels. In a 4-bit per cell embodiment, a verify of all non-erased states would need 15 verify operations between program pulses.

To improve performance, some verify operations can be omitted during the programming operation through use of smart-verify algorithms to reduce programming time. For example, an embodiment a smart-verify operation for word line WLn performs a program-verify iteration on memory cells of String0 coupled to word line WLn.

In an embodiment, the program-verify iteration determines a minimum number of program loops (referred to herein as "smart-verify loop count") needed to program memory cells of String0 to a particular programmed state (e.g., the lowest programmed state S1 in FIG. 5 or 7E). The process of determining a smart-verify loop count is also referred to herein as "smart-verify acquisition," and the determined smart-verify loop count is also referred to herein as the acquired smart-verify loop count.

The acquired smart-verify loop count is then used to determine a smart-verify starting program voltage for programming memory cells of String1-String3 coupled to word line WLn. In particular, the smart-verify starting program voltage $V_{PSn}$ for memory cells of String1-String3 coupled to word line WLn is:

$$V_{PS} = V_{Pinit} + SVloop_n \times \Delta V_{PS} \quad (1)$$

where $SVloop_n$ is the acquired smart-verify loop count for word line WLn, and $\Delta V_{PS}$ is a program step size for smart-verify (e.g., a step size of between about 0.1V to about 1.0V, or some other value). That is, the determined smart-verify starting program voltage $V_{PSn}$ for memory cells of String1-String3 coupled to word line WLn is initial program voltage $V_{Pinit}$ plus the acquired smart-verify loop count multiplied by program step size for smart-verify $\Delta V_{PS}$. In some embodiments, program step size for smart-verify $\Delta V_{PS}$ may have a same or a different value than program step size $\Delta V_P$. For example, in an embodiment program step size for smart-verify $\Delta V_{PS}$ is less than program step size $\Delta V_P$.

This same process is repeated for each subsequent word line (e.g., word lines WLn+1, WLn+2, . . . ), first performing a program-verify iteration on memory cells of String0 coupled to the word line to acquire a smart-verify loop count for those memory cells, and then using the acquired smart-verify loop count to determine a smart-verify starting program voltage $V_{PSn}$ for programming memory cells of String1-String3 coupled to the word line.

As described above, verify processes consume a significant portion of a program operation. To improve performance, a programming technique sometimes referred to as "one program, zero verify" or "1P0V" is used to program memory devices without performing any verify operations. In embodiments, 1P0V may be used to program SLC memory devices that may be programmed/erased between an erased state (Er) and a programmed state (S1).

Figure 10:
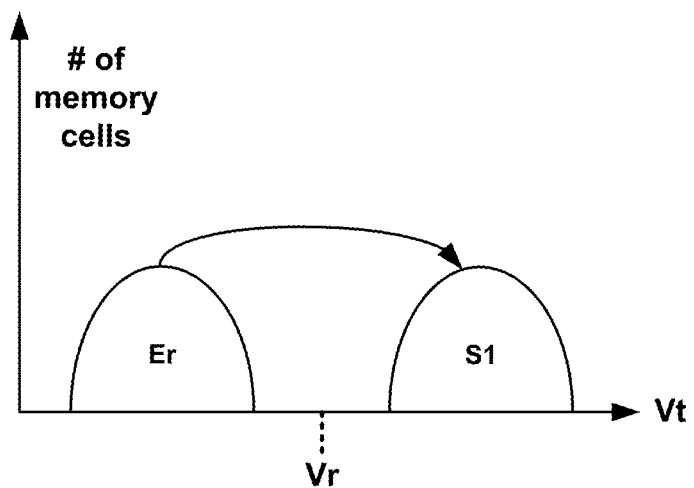
FIG. 10 depicts various threshold voltage distributions and describes a process for programming non-volatile memory.

In an embodiment of a 1P0V process, a single program pulse having an initial program voltage $V_P$ is used to program a SLC memory device to programmed state S1, and no verify operations are performed. FIG. 10 illustrates example threshold voltage distributions for a memory array when each memory cell stores two bits of data, programmed using such a 1P0V technique.

In such an embodiment, successful programming requires that the threshold voltages of the memory cells reliably reach programmed state S1 after a single program pulse. Indeed, because there is no opportunity to apply additional program pulses, if a single program pulse shifts the threshold voltage of a memory cell by too little, reliably distinguishing between erased state Er and programmed state S1 will not be possible. For example, if the initial program voltage of the program pulse is too low, such that the threshold voltage of the memory cell after programming is below read reference voltage Vr, the "programmed" memory cell may be read as being in the erased state Er instead of programmed state S1.

Non-volatile memory cells such as those described above often experience programming variations over time. In particular, the gate oxide of memory cells can degrade with an increasing number of program-erase (PE) cycles, resulting in a larger threshold voltage Vth increase with the application of each program pulse.

For example, applying a program pulse having an initial program voltage $V_{Pa}$ to a memory cell that has not been significantly used (also called a "fresh" device) may increase the threshold voltage of the memory cell to a first threshold voltage Vth1. After the memory cell has been exposed to number of PE cycles (e.g., 10,000 PE cycles), applying a program pulse having the same initial program voltage $V_{Pa}$ to the memory cell may increase the threshold voltage to a second threshold voltage Vth2, where Vth2 is greater than Vth1. In other words, the same initial program voltage results in a larger threshold voltage Vth increase as the number of PE cycles increases.

To avoid overprogramming memory cells, a technique to counteract this effect adjusts the initial program voltage of program pulses applied to each memory cell based on the number of PE cycles to which the memory cell has been exposed. In an embodiment, this adaptive initial program voltage technique decreases the initial program voltage of program pulses with increasing numbers of PE cycles, with a goal of attempting to achieve the same programmed state threshold voltage distribution as at fresh.

In an embodiment, a first program pulse having a first initial program voltage $V_{P0}$ is used to program a memory cell for a first number of PE cycles (e.g., 10,000 PE cycles), a second program pulse having second initial program voltage $V_{P1}$ ($V_{P1}<V_{P0}$) is used to program the memory cell for the next 10,000 PE cycles, a third program pulse having third initial program voltage $V_{P2}$ ($V_{P2}<V_{P1}$) is used to program the memory cell for the next 10,000 PE cycles, and so on.

In an embodiment, an adaptive initial program voltage technique adjusts initial program voltages in groups or "bands" of PE cycles, and applies program pulses having the same initial program voltage to memory cells that have been exposed to PE cycles anywhere within the band. For example, program pulses having first initial program voltage $V_{P0}$ are used to program memory cells exposed to anywhere between 0-9,999 PE cycles, program pulses having second initial program voltage $V_{P1}$ is used to program memory cells exposed to anywhere between 10,000-19,999 PE cycles, program pulses having third initial program voltage $V_{P2}$ is used to program memory cells exposed to anywhere between 20,000-29,999 PE cycles, and so on. In an embodiment, the PE bands include the same number of PE cycles (e.g., 10,000 cycles). In other embodiments, the PE bands may include different numbers of PE cycles.

For example, if memory cells in a memory array each have a maximum endurance of j=110,000 PE cycles, and each PE band includes k=10,000 PE cycles, there are a total of L=j/k=11 PE bands above the "fresh" PE band, and the initial program voltage program for each PE band is illustrated in Table 1:

TABLE 1

| PE Band | PE cycles | Initial Program Voltage |
|---|---|---|
| | 0-9,999 | $V_{P0}$ |
| 1 | 10,000-19,999 | $V_{P1}$ |
| 2 | 20,000-29,999 | $V_{P2}$ |
| 3 | 30,000-39,999 | $V_{P3}$ |

TABLE 1-continued

| PE Band | PE cycles | Initial Program Voltage |
|---|---|---|
| 4 | 40,000-49,999 | $V_{P4}$ |
| 5 | 50,000-59,999 | $V_{P5}$ |
| 6 | 60,000-69,999 | $V_{P6}$ |
| 7 | 70,000-79,999 | $V_{P7}$ |
| 8 | 80,000-89,999 | $V_{P8}$ |
| 9 | 90,000-99,999 | $V_{P9}$ |
| 10 | 100,000-109,999 | $V_{P10}$ |
| 11 | 110,000 | $V_{P11}$ | where $V_{P0}$ is the initial program voltage of program pulses applied at fresh. Other values of j, k and L may be used. In an embodiment, the initial program voltage $V_{Pm}$ for PE band m may be expressed as:

$$V_{Pm}=V_{P0}-\Delta V_m, m=1,2,\ldots,L \quad (1)$$

where $\Delta V_m$ is an adaptive initial program voltage shift for PE band m that is determined based on the number of PE cycles and an average increase of programmed state S1 threshold voltage Vt position with cycling across all word lines. Thus, using Equation (1) in Table 1, the example initial program voltages are illustrated in Table 2:

TABLE 2

| PE Band | PE cycles | Initial Program Voltage |
|---|---|---|
| | 0-9,999 | $V_{P0}$ |
| 1 | 10,000-19,999 | $V_{P0}-\Delta V_1$ |
| 2 | 20,000-29,999 | $V_{P0}-\Delta V_2$ |
| 3 | 30,000-39,999 | $V_{P0}-\Delta V_3$ |
| 4 | 40,000-49,999 | $V_{P0}-\Delta V_4$ |
| 5 | 50,000-59,999 | $V_{P0}-\Delta V_5$ |
| 6 | 60,000-69,999 | $V_{P0}-\Delta V_6$ |
| 7 | 70,000-79,999 | $V_{P0}-\Delta V_7$ |
| 8 | 80,000-89,999 | $V_{P0}-\Delta V_8$ |
| 9 | 90,000-99,999 | $V_{P0}-\Delta V_9$ |
| 10 | 100,000-109,999 | $V_{P0}-\Delta V_{10}$ |
| 11 | 110,000 | $V_{P0}-\Delta V_{11}$ |

In an embodiment, adaptive initial program voltage shift $\Delta V_m$=100 mV×m. For example, $\Delta V_1$=100 mV, $\Delta V_2$=200 mV, $\Delta V_3$=300 mV, and so on. Other values of adaptive initial program voltage shift $\Delta V_m$ may be used.

In an embodiment, for each PE band m, the same adaptive initial program voltage shift $\Delta V_m$ is applied to all word lines in a memory array. Such adaptive initial program voltage techniques are referred to herein as "all word line adaptive initial program voltage techniques." For example, using Table 2, above, for memory cells in PE band 2, the adaptive initial program voltage shift $\Delta V_2$ is used for programming the memory cells across all word lines. Likewise, for memory cells in PE band 7, the adaptive initial program voltage shift $\Delta V_7$ is used for programming the memory cells across all word lines, and so on All word line adaptive initial program voltage techniques may be problematic for memory cells programmed using the various programming techniques described above. In particular, the amount of threshold voltage increase with PE cycles may vary significantly across word lines in a memory array, such as the three dimensional memory structure described above and depicted in FIGS. 4C-4E.

Indeed, FIG. 11 depicts example values of the average shift in the lower tail of the programmed state S1 threshold voltage distribution after cycling compared with fresh as a function of word line number. In particular, five curves are shown depicting example values of the average shift in the lower tail of the programmed state S1 threshold voltage distribution compared with fresh after 10K, 50K, 75K, 100K and 110K PE cycles across a memory array that includes 112 word lines.

In the illustrated example, for word line 20 the average shift in the lower tail of the programmed state S1 threshold voltage distribution compared with fresh after 10K, 50K, 75K, 100K and 110K PE cycles is approximately 150 mV, 550 mV, 700 mV, 880 mV, and 910 mV, respectively. In contrast, for word line 65 the average shift in the lower tail of the programmed state S1 threshold voltage distribution compared with fresh after 10K, 50K, 75K, 100K and 110K PE cycles is approximately 290 mV, 870 mV, 1.09V, 1.28V, and 1.32V, respectively.

In addition, for a fixed number of PE cycles the average shift in the lower tail of the programmed state S1 threshold voltage distribution compared with fresh varies substantially across the word lines. In the illustrated example, at 10K PE cycles, the average shift in the lower tail of the programmed state S1 threshold voltage distribution compared with fresh varies by about 150 mV across the 112 word lines. In the illustrated example, at 110K PE cycles, the average shift in the lower tail of the programmed state S1 threshold voltage distribution compared with fresh varies by about 420 mV across the 112 word lines.

Because of such significant variation in threshold voltage shift across the word lines of a memory array, an all word line adaptive initial program voltage technique that applies the same adaptive program voltage shift $\Delta V_m$ to memory cells in PE band m across all word lines in a memory array may impair the reliability of the memory array.

For example, each horizontal line in FIG. 11 is the mean of the values of the corresponding average shift curve across all word lines, and will be referred to herein as the "mean line." For example, at 10K PE cycles the average shift in the lower tail of the programmed state S1 threshold voltage distribution compared with fresh across all word lines has a mean value $\mu_{10}$ of approximately 220 mV. At 50K PE cycles the average shift in the lower tail of the programmed state S1 threshold voltage distribution compared with fresh across all word lines has a mean value $\mu_{50}$ of approximately 700 mV. At 75K PE cycles the average shift in the lower tail of the programmed state S1 threshold voltage distribution compared with fresh across all word lines has a mean value $\mu_{75}$ of approximately 880 mV. At 100K PE cycles the average shift in the lower tail of the programmed state S1 threshold voltage distribution compared with fresh across all word lines has a mean value moo of approximately 1.050V. At 110K PE cycles the average shift in the lower tail of the programmed state S1 threshold voltage distribution compared with fresh across all word lines has a mean value $\mu_{110}$ of approximately 1.105V.

If the mean values $\mu_{10}, \mu_{50}, \ldots, \mu_{100}, \mu_{110}$ are used as the adaptive initial program voltage shift values $\Delta V_1$, $\Delta V_5, \ldots, \Delta V_{10}, \Delta V_{11}$, respectively, for all 112 word lines, the initial program voltage for some word lines will be shifted by too much (referred to herein as "over-shifted"), whereas the initial program voltage for other word lines will shifted by too little (referred to herein as "under-shifted").

For example, referring to the curve for 50K PE cycles, using an adaptive initial program voltage shift $\Delta V_5 = \mu_{50} = 700$ mV, the initial program voltage for memory cells coupled to word line 20 is over-shifted by about 700 mV-550 mV=150 mV, whereas the initial program voltage for memory cells coupled to word line 65 is under-shifted by about 870 mV-700 mV=170 mV. Similar over-shifts and under-shifts exist for word lines for each of the PE cycle curves depicted in FIG. 11.

For 1P0V programming techniques, over-shifted memory cells may cause reliability problems if the threshold voltage of the programmed memory cells are too low (e.g., such that the threshold voltage is below read reference voltage Vr). For ISPP programming techniques, over-shifted memory cells may cause performance to suffer (e.g., requiring more program loops), and under-shifted memory cells may cause reliability problems because initial program voltages that are too high may cause over-programming of memory cells.

Technology is described to provide a word line zoned adaptive initial program voltage technique. In particular, a word line zoned adaptive initial program voltage technique is described that divides N word lines in a memory array into q word line zones, where q is an integer having a value $2 \leq q \leq N$. For example, N=112 word lines and q=8 word line zones, although other values for N and q may be used.

In an embodiment, each word line zone includes consecutive word lines. For example, a first word line zone includes word lines 3-33, a second word line zone includes word lines 34-39, a third word line zone includes word lines 40-68, and so on. In an embodiment, the number of word lines in each word line zone may be the same, or may vary from zone to zone. In an embodiment, the word line zones are non-overlapping—that is, the word lines in each word line zone are unique, and each word line is included in at most one word line zone.

In an embodiment, for each PE band m, and for each word line zone z, word line zoned adaptive initial program voltages may be expressed as:

$$V_{Pmz} = V_{P0} - a\Delta V_{mz} \quad (2)$$

where $V_{P0}$ is the initial program voltage of program pulses applied at fresh, and $a\Delta V_{mz}$ is a word line zoned adaptive initial program voltage shift for PE band m and word line zone z. In an embodiment, $a\Delta V_{mz}$ is determined based on the number of PE cycles and an average increase of programmed state S1 threshold voltage Vt position with cycling across word lines in word line zone z. In other embodiments, $a\Delta V_{mz}$ may be determined based on the number of PE cycles and some other function of the increase of programmed state S1 threshold voltage Vt position with cycling across word lines in word line zone z.

Thus, in contrast to an all word line adaptive initial program voltage technique such as described above, in which the same adaptive initial program voltage shift $\Delta V_m$ is applied to memory cells in PE band m coupled to all word lines, in an embodiment of a word line zoned adaptive initial program voltage technique, a corresponding word line zoned adaptive initial program voltage shift $a\Delta V_{mz}$ is applied to memory cells in PE band m coupled to word lines in word line zone z, and the word line zoned adaptive initial program voltage shift $a\Delta V_{mz}$ may vary from word line zone to word line zone.

Figure 12B:
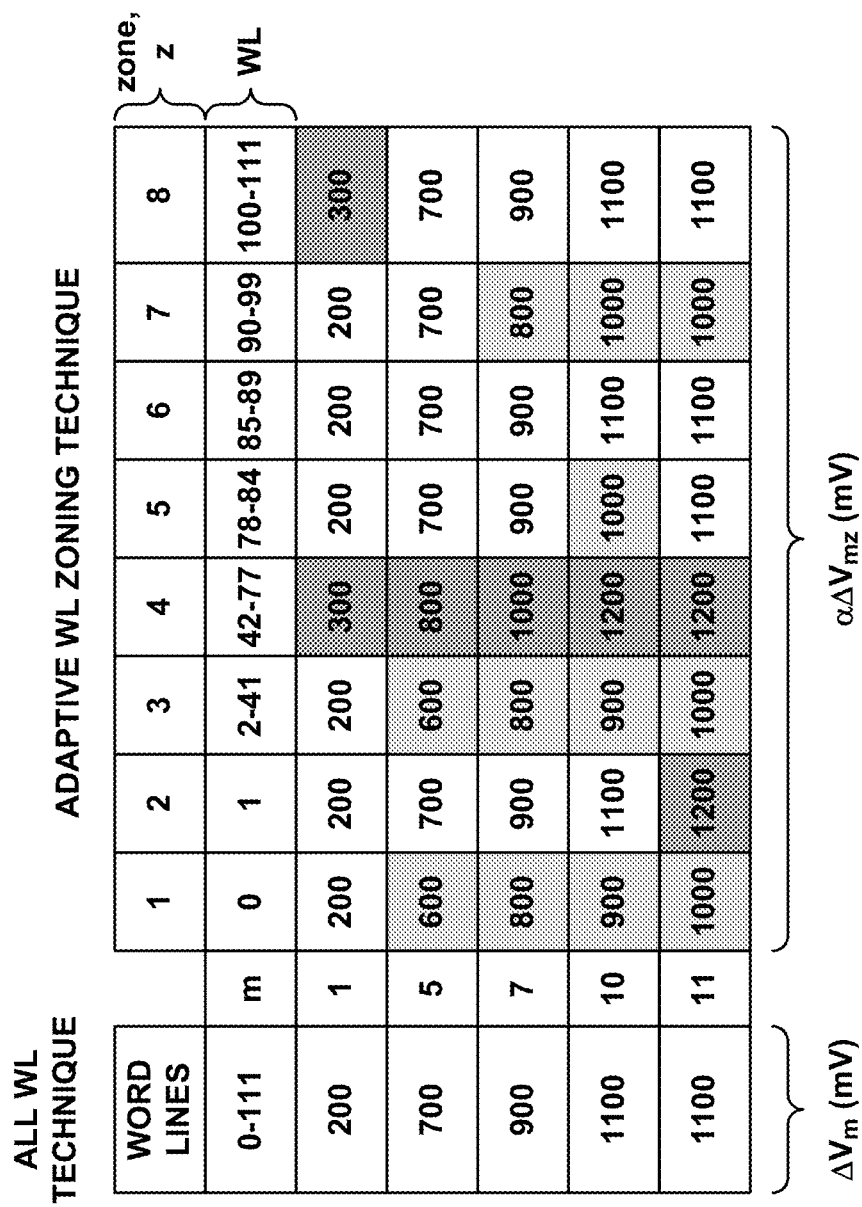

FIGS. 12A-12B depict an example embodiment of a word line zoned adaptive initial program voltage technique. In particular, FIG. 12A depicts the diagram of FIG. 11 divided into q=8 word line zones for five PE bands m:

| WL Zone, s | Word Line(s) | PE band, m | | | | |
|---|---|---|---|---|---|---|
| | | 1 | 5 | 7 | 10 | 11 |
| 1 | 0 | $a\Delta V_{11}$ | $a\Delta V_{51}$ | $a\Delta V_{71}$ | $a\Delta V_{101}$ | $a\Delta V_{111}$ |
| 2 | 1 | $a\Delta V_{12}$ | $a\Delta V_{52}$ | $a\Delta V_{72}$ | $a\Delta V_{102}$ | $a\Delta V_{112}$ |
| 3 | 2-41 | $a\Delta V_{13}$ | $a\Delta V_{53}$ | $a\Delta V_{73}$ | $a\Delta V_{103}$ | $a\Delta V_{113}$ |
| 4 | 42-77 | $a\Delta V_{14}$ | $a\Delta V_{54}$ | $a\Delta V_{74}$ | $a\Delta V_{104}$ | $a\Delta V_{114}$ |
| 5 | 78-84 | $a\Delta V_{13}$ | $a\Delta V_{55}$ | $a\Delta V_{75}$ | $a\Delta V_{105}$ | $a\Delta V_{115}$ |

-continued

| WL Zone, s | Word Line(s) | PE band, m | | | | |
|---|---|---|---|---|---|---|
| | | 1 | 5 | 7 | 10 | 11 |
| 6 | 85-89 | a$\Delta V_{16}$ | a$\Delta V_{56}$ | a$\Delta V_{76}$ | a$\Delta V_{106}$ | a$\Delta V_{116}$ |
| 7 | 90-99 | a$\Delta V_{17}$ | a$\Delta V_{57}$ | a$\Delta V_{77}$ | a$\Delta V_{107}$ | a$\Delta V_{117}$ |
| 8 | 100-111 | a$\Delta V_{18}$ | a$\Delta V_{58}$ | a$\Delta V_{78}$ | a$\Delta V_{108}$ | a$\Delta V_{118}$ |

FIG. 12B includes example values for word line zoned adaptive initial program voltage shifts a$\Delta V_{mz}$, and for comparison also includes example values for all word line adaptive initial program voltage shifts $\Delta V_m$. In the diagram, boxes shaded in light gray have values of word line zoned adaptive initial program voltage shift a$\Delta V_{mz}$ that are lower than the corresponding all word line adaptive initial program voltage shift $\Delta V_m$. In other words, the word line zoned initial program voltages for those word line zones are shifted less than the amount of shift using an all word lines adaptive initial program voltage technique. For example, for word line zone z=3 and PE band m=7, the word line zoned adaptive initial program voltage shift is 800 mV, whereas the all word line adaptive initial program voltage shift for PE band m=7 is 900 mV.

In contrast, boxes shaded in darker gray have values of word line zoned adaptive initial program voltage shift a$\Delta V_{mz}$ that are greater than the corresponding all word line adaptive initial program voltage shift $\Delta V_m$. In other words, the word line zoned initial program voltages for those word line zones are shifted more than the amount of shift using an all word lines adaptive initial program voltage technique. For example, for word line zone z=4 and PE band m=5, the word line zoned adaptive initial program voltage shift is 800 mV, whereas the all word line adaptive initial program voltage shift for PE band m=5 is 700 mV.

Using the example values in FIG. 12B, for memory cells that have been exposed to 75,000 PE cycles (PE band m=7), the word line zoned initial program voltages are determined as follows:

| WL Zone | Word Line(s) | Initial Program Voltage |
|---|---|---|
| 1 | 0 | $V_{P71} = V_{P0} - 800$ mV |
| 2 | 1 | $V_{P72} = V_{P0} - 900$ mV |
| 3 | 2-41 | $V_{P73} = V_{P0} - 800$ mV |
| 4 | 42-77 | $V_{P74} = V_{P0} - 1000$ mV |
| 5 | 78-84 | $V_{P75} = V_{P0} - 900$ mV |
| 6 | 85-89 | $V_{P76} = V_{P0} - 900$ mV |
| 7 | 90-99 | $V_{P77} = V_{P0} - 800$ mV |
| 8 | 100-111 | $V_{P78} = V_{P0} - 900$ mV |

In contrast, using an all word line adaptive initial program voltage technique, an initial program voltage of $V_{P7}=V_{P0}-900$ mV is applied to memory cells coupled to all word lines.

In an embodiment, the number of word line zones q, and the specific word lines included in each word line zone z may be determined in a variety of ways. Increasing the number of word line zones q may increase reliability, but may also increase complexity. In the example depicted in FIG. 12A, q=8 word line zones are used.

The specific word lines included in each word line zone may be determined based on a variety of factors. In the example depicted in FIGS. 12A-12B, word lines 0 and 1 are assigned corresponding word line zones 1 and 2, respectively, because those word lines are near the edge of a memory array and may exhibit atypical behavior. For all other word lines, the specific word lines included in each word line zone are assigned based on the locations where each curve crosses the corresponding mean lines.

For example, word line zone 3 includes word lines 2-41 because the average increase of programmed state S1 threshold voltage Vt position with cycling for each curve is below the corresponding mean lines for word lines 2-41. Word line zone 4 includes word lines 42-77 because the average increase of programmed state S1 threshold voltage Vt position with cycling for each curve is above the corresponding mean lines for word lines 42-77. Word line zone 5 includes word lines 78-84 because the average increase of programmed state S1 threshold voltage Vt position with cycling for each curve is below the corresponding mean lines for word lines 78-84. Word line zone 6 includes word lines 85-89 because the average increase of programmed state S1 threshold voltage Vt position with cycling for each curve is above the corresponding mean lines for word lines 85-89. Word line zone 7 includes word lines 90-99 because the average increase of programmed state S1 threshold voltage Vt position with cycling for each curve is below the corresponding mean lines for word lines 90-99. Word line zone 8 includes word lines 100-111 because the average increase of programmed state S1 threshold voltage Vt position with cycling for each curve is above the corresponding mean lines for word lines 100-111. Other techniques may be used to select the specific word lines included in each word line zone.

Figure 12C:
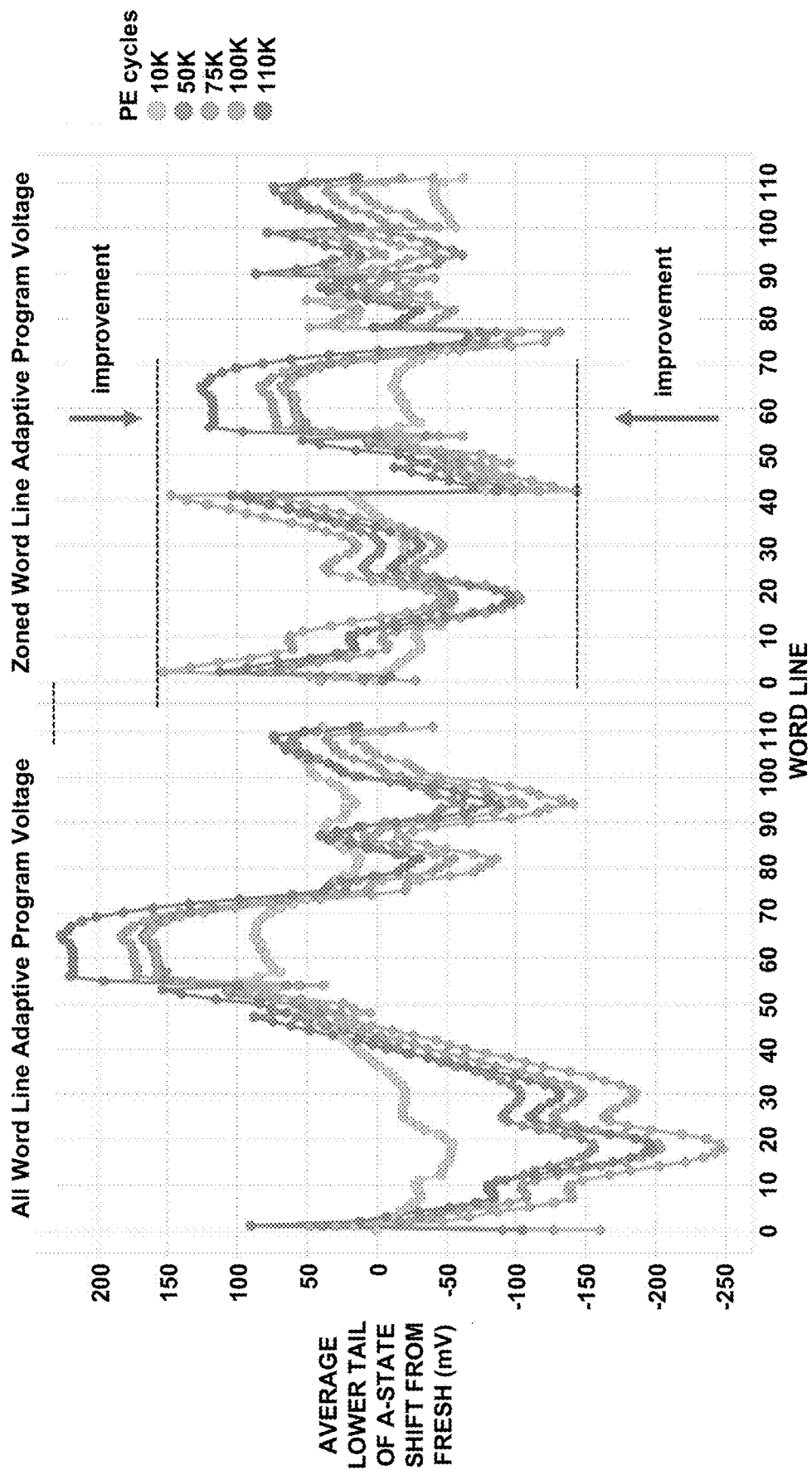
FIG. 12C depicts diagrams showing an average lower tail of a programmed state threshold voltage distribution shift from fresh as a function of word line number after various program erase cycles.

FIG. 12C includes diagrams showing the average lower tail of the programmed state S1 threshold voltage distribution shift from fresh as a function of word line number after 10K, 50K, 75K, 100K and 110K PE cycles. The diagram on the left depicts the shift values using an all word line adaptive program voltage technique (e.g., using the example all word line adaptive initial program voltage shift $\Delta V_m$ values of FIG. 12B). The diagram on the right depicts the shift values using a word line zone adaptive initial program voltage technique such as described above (e.g., using the example word line zoned adaptive initial program voltage shift a$\Delta V_{mz}$ values of FIG. 12B).

For the all word line adaptive initial program voltage technique, the maximum variation in the average lower tail of the programmed state S1 threshold voltage distribution shift from fresh is about 475 mV.

In contrast, for the word line zoned adaptive initial program voltage technique, the maximum variation in the average lower tail of the programmed state S1 threshold voltage distribution shift from fresh is about 295 mV, for an improvement of about 180 mV (approximately 40% reduction in maximum variation).

The example embodiment depicted in FIGS. 12A-12C utilized q=8 word line zones. Without wanting to be bound by any particular theory, it is believed that increasing the number of zones may offer further improvement and may further reduce the maximum variation in the average lower tail of the programmed state S1 threshold voltage distribution shift from fresh.

Figure 13A:
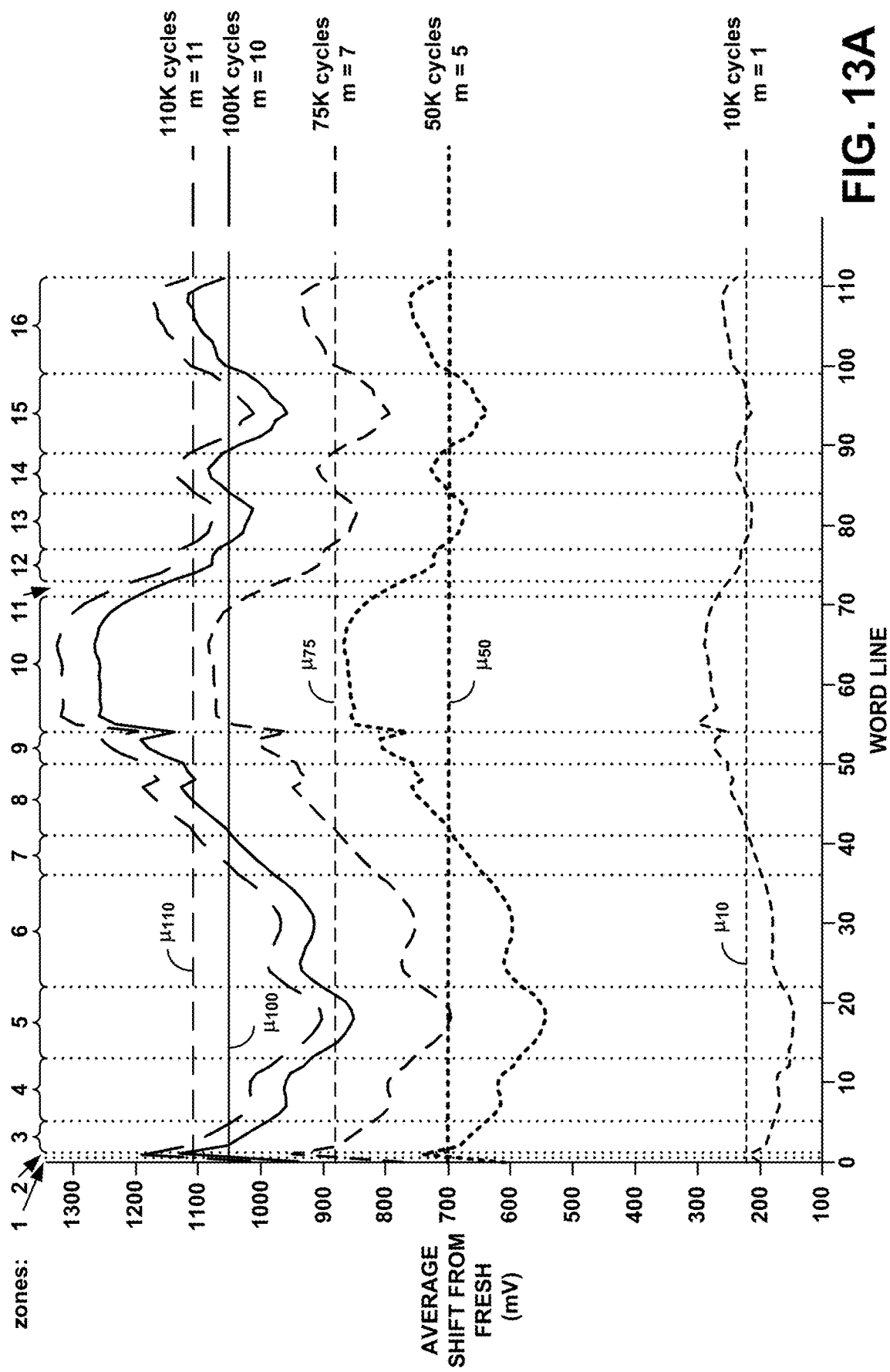
FIGS. 13A-13B depict an example embodiment of another word line zoned adaptive program voltage technique.
Figure 13B:
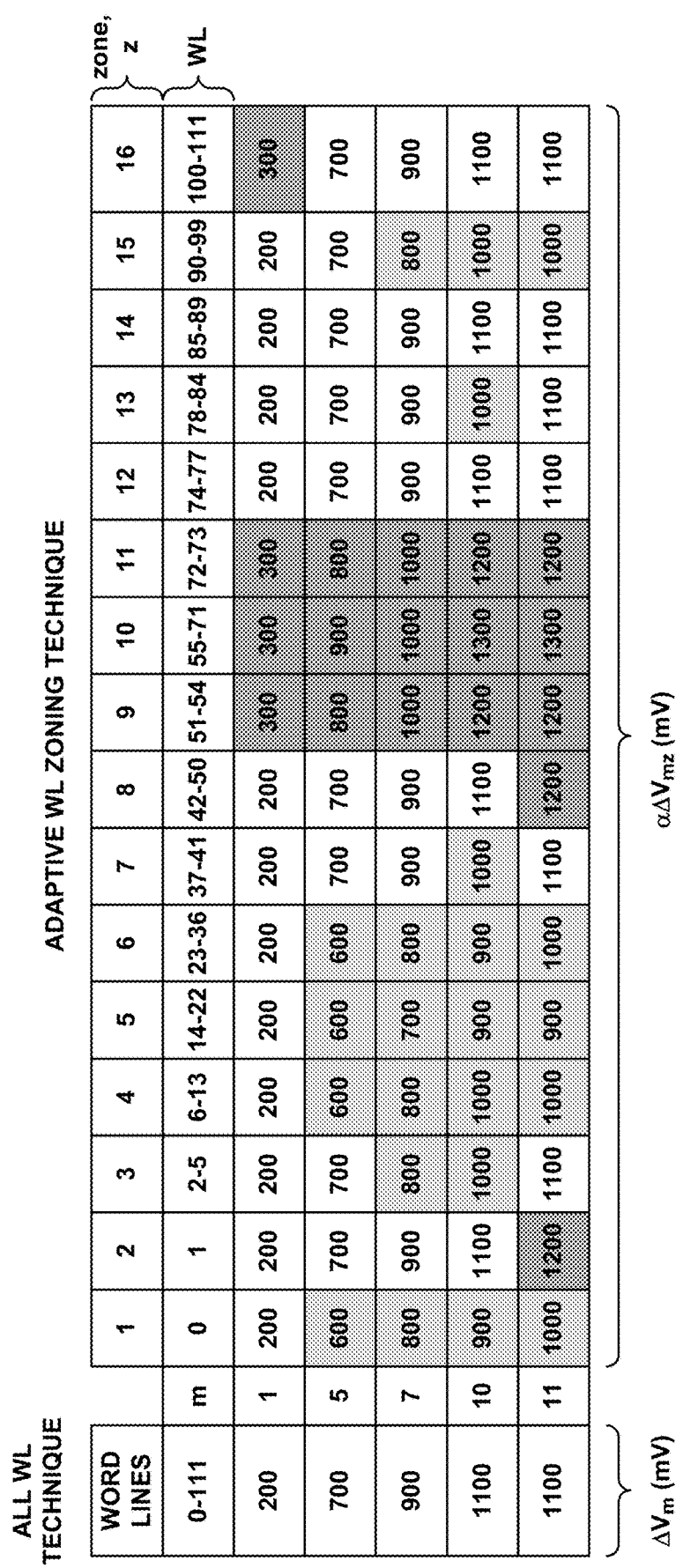

For example, FIGS. 13A-13B depict another example embodiment of a word line zoned adaptive initial program voltage technique. In particular, FIG. 13A depicts the diagram of FIG. 11 divided into q=16 word line zones for five PE bands m:

| WL Zone, s | Word Line(s) | PE band, m | | | | |
|---|---|---|---|---|---|---|
| | | 1 | 5 | 7 | 10 | 11 |
| 1 | 0 | $a\Delta V_{11}$ | $a\Delta V_{51}$ | $a\Delta V_{71}$ | $a\Delta V_{101}$ | $a\Delta V_{111}$ |
| 2 | 1 | $a\Delta V_{12}$ | $a\Delta V_{52}$ | $a\Delta V_{72}$ | $a\Delta V_{102}$ | $a\Delta V_{112}$ |
| 3 | 2-5 | $a\Delta V_{13}$ | $a\Delta V_{53}$ | $a\Delta V_{73}$ | $a\Delta V_{103}$ | $a\Delta V_{113}$ |
| 4 | 6-13 | $a\Delta V_{14}$ | $a\Delta V_{54}$ | $a\Delta V_{74}$ | $a\Delta V_{104}$ | $a\Delta V_{114}$ |
| 5 | 14-22 | $a\Delta V_{15}$ | $a\Delta V_{55}$ | $a\Delta V_{75}$ | $a\Delta V_{105}$ | $a\Delta V_{115}$ |
| 6 | 23-36 | $a\Delta V_{16}$ | $a\Delta V_{56}$ | $a\Delta V_{76}$ | $a\Delta V_{106}$ | $a\Delta V_{116}$ |
| 7 | 37-41 | $a\Delta V_{17}$ | $a\Delta V_{57}$ | $a\Delta V_{77}$ | $a\Delta V_{107}$ | $a\Delta V_{117}$ |
| 8 | 42-50 | $a\Delta V_{18}$ | $a\Delta V_{58}$ | $a\Delta V_{78}$ | $a\Delta V_{108}$ | $a\Delta V_{118}$ |
| 9 | 51-54 | $a\Delta V_{19}$ | $a\Delta V_{59}$ | $a\Delta V_{79}$ | $a\Delta V_{109}$ | $a\Delta V_{119}$ |
| 10 | 55-71 | $a\Delta V_{110}$ | $a\Delta V_{510}$ | $a\Delta V_{710}$ | $a\Delta V_{1010}$ | $a\Delta V_{1110}$ |
| 11 | 72-73 | $a\Delta V_{111}$ | $a\Delta V_{511}$ | $a\Delta V_{711}$ | $a\Delta V_{1011}$ | $a\Delta V_{1111}$ |
| 12 | 74-77 | $a\Delta V_{112}$ | $a\Delta V_{512}$ | $a\Delta V_{712}$ | $a\Delta V_{1012}$ | $a\Delta V_{1112}$ |
| 13 | 78-84 | $a\Delta V_{113}$ | $a\Delta V_{513}$ | $a\Delta V_{713}$ | $a\Delta V_{1013}$ | $a\Delta V_{1113}$ |
| 14 | 85-89 | $a\Delta V_{114}$ | $a\Delta V_{514}$ | $a\Delta V_{714}$ | $a\Delta V_{1014}$ | $a\Delta V_{1114}$ |
| 15 | 90-99 | $a\Delta V_{115}$ | $a\Delta V_{515}$ | $a\Delta V_{715}$ | $a\Delta V_{1015}$ | $a\Delta V_{1115}$ |
| 16 | 100-111 | $a\Delta V_{116}$ | $a\Delta V_{516}$ | $a\Delta V_{716}$ | $a\Delta V_{1016}$ | $a\Delta V_{1116}$ |

FIG. 13B includes example values for word line zoned adaptive initial program voltage shifts $a\Delta V_{mz}$, and for comparison also includes example values for all word line adaptive initial program voltage shifts $\Delta V_m$. In the diagram, boxes shaded in light gray have values of word line zoned adaptive initial program voltage shift $a\Delta V_{mz}$ that are lower than the corresponding all word line adaptive initial program voltage shift $\Delta V_m$.

In other words, the word line zoned initial program voltages for those word line zones are shifted less than the amount of shift using an all word lines adaptive initial program voltage technique. For example, for word line zone z=6 and PE band m=10, the word line zoned adaptive initial program voltage shift is 1000 mV, whereas the all word line adaptive initial program voltage shift for PE band m=10 is 1100 mV.

In contrast, boxes shaded in darker gray have values of word line zoned adaptive initial program voltage shift $a\Delta V_{mz}$ that are greater than the corresponding all word line adaptive initial program voltage shift $\Delta V_m$. In other words, the word line zoned initial program voltages for those word line zones are shifted more than the amount of shift using an all word lines adaptive initial program voltage technique. For example, for word line zone z=11 and PE band m=7, the word line zoned adaptive initial program voltage shift is 1000 mV, whereas the all word line adaptive initial program voltage shift for PE band m=7 is 900 mV.

Using the example values in FIG. 13B, for memory cells that have had 10,000 PE cycles (PE band m=10), the word line zoned initial program voltages are determined as follows:

| WL Zone | Word Line(s) | Initial Program Voltage |
|---|---|---|
| 1 | 0 | $V_{P101} = V_{P0} - 900$ mV |
| 2 | 1 | $V_{P102} = V_{P0} - 1100$ mV |
| 3 | 2-5 | $V_{P103} = V_{P0} - 1000$ mV |
| 4 | 6-13 | $V_{P104} = V_{P0} - 1000$ mV |
| 5 | 14-22 | $V_{P105} = V_{P0} - 900$ mV |
| 6 | 23-36 | $V_{P106} = V_{P0} - 900$ mV |
| 7 | 37-41 | $V_{P107} = V_{P0} - 1000$ mV |
| 8 | 42-50 | $V_{P108} = V_{P0} - 1100$ mV |
| 9 | 51-54 | $V_{P109} = V_{P0} - 1200$ mV |
| 10 | 55-71 | $V_{P1010} = V_{P0} - 1300$ mV |
| 11 | 72-73 | $V_{P1011} = V_{P0} - 1200$ mV |
| 12 | 74-77 | $V_{P1012} = V_{P0} - 1100$ mV |
| 13 | 78-84 | $V_{P1013} = V_{P0} - 1000$ mV |
| 14 | 85-89 | $V_{P1014} = V_{P0} - 1100$ mV |
| 15 | 90-99 | $V_{P1015} = V_{P0} - 1000$ mV |
| 16 | 100-111 | $V_{P1016} = V_{P0} - 1100$ mV |

In contrast, using an all word line adaptive initial program voltage technique, an initial program voltage of $V_{P10} = V_{P0} - 1100$ mV would be applied to memory cells coupled to all word lines.

Figure 13C:
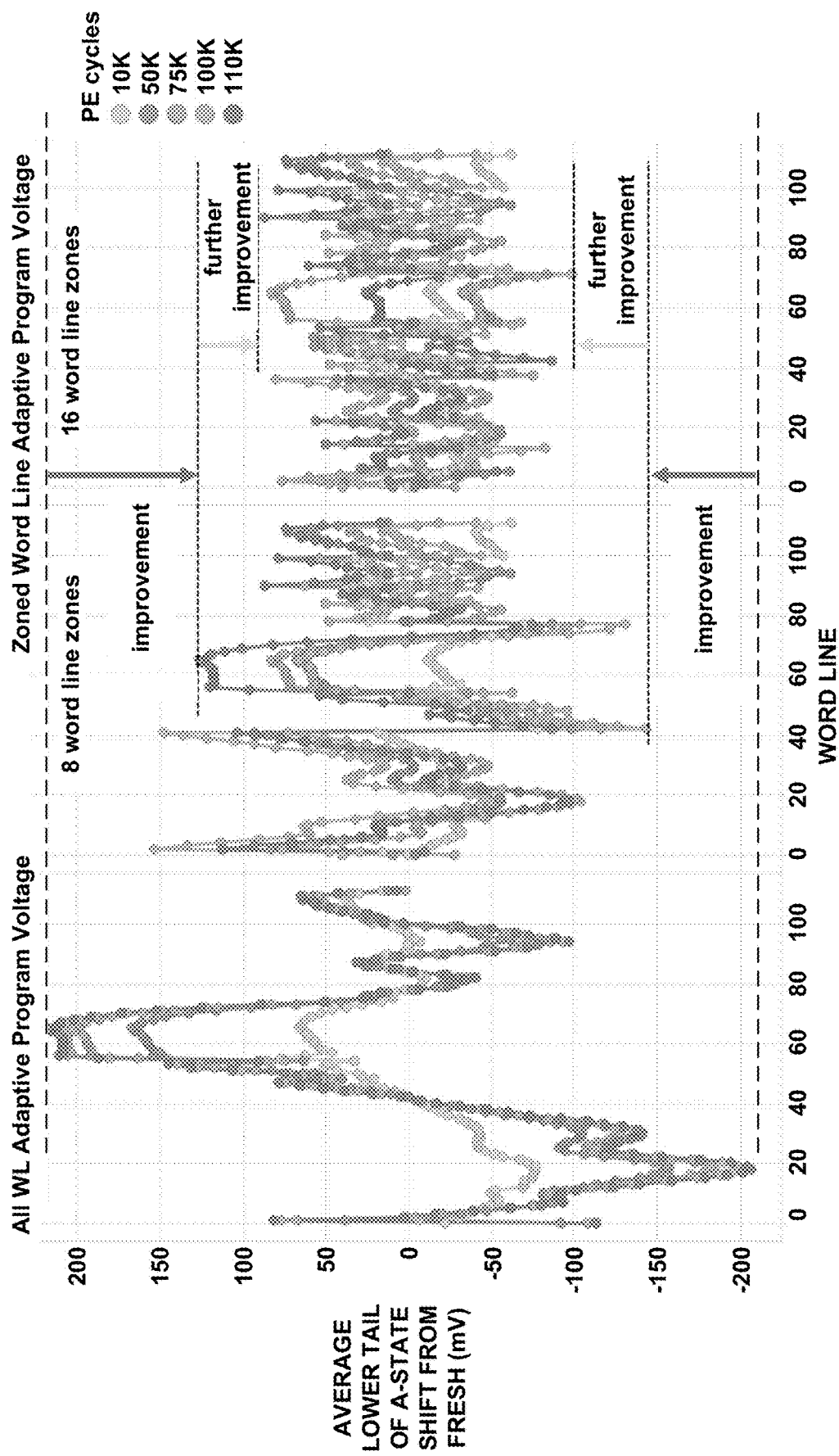
FIG. 13C depicts diagrams showing an average lower tail of a programmed state threshold voltage distribution shift from fresh as a function of word line number after various program erase cycles.

FIG. 13C includes diagrams showing the average lower tail of the programmed state S1 threshold voltage distribution shift from fresh as a function of word line number after 10K, 50K, 70K, 100K and 110K PE cycles. The diagram on the left depicts the shift values using an all word line adaptive program voltage technique (e.g., using the example all word line adaptive program voltage shift $\Delta V_m$ values of FIGS. 12B and 13B). The diagram in the middle depicts the shift values using a word line zone adaptive initial program voltage technique such as described above with z=8 zones (e.g., using the example word line zoned adaptive initial program voltage shift $a\Delta V_{mz}$ values of FIG. 12B). The diagram on the right depicts the shift values using a word line zone adaptive initial program voltage technique such as described above with z=16 zones (e.g., using the example word line zoned adaptive initial program voltage shift $a\Delta V_{mz}$ values of FIG. 13B).

For the all word line adaptive initial program voltage technique, the maximum variation in the average lower tail of the programmed state S1 threshold voltage distribution shift from fresh is about 475 mV.

In contrast, for the word line zoned adaptive initial program voltage technique with z=8 word line zones, the maximum variation in the average lower tail of the programmed state S1 threshold voltage distribution shift from fresh is about 295 mV, for an improvement of about 180 mV (approximately 40% reduction in maximum variation).

In contrast, for the word line zoned adaptive initial program voltage technique with z=16 word line zones, the maximum variation in the average lower tail of the programmed state S1 threshold voltage distribution shift from fresh is about 185 mV, for an improvement of about 290 mV (approximately 60% reduction in maximum variation).

One embodiment includes an apparatus that includes a plurality of word lines that include a plurality of word line zones, a plurality of non-volatile memory cells coupled to the plurality of word lines, and a control circuit coupled to the non-volatile memory cells. The control circuit is configured to determine a corresponding initial program voltage for each of the word line zones. Each corresponding initial program voltage is determined based on a number of program erase cycles.

One embodiment includes an apparatus that includes a plurality of word lines that include a plurality of word line zones, a plurality of non-volatile memory cells coupled to the plurality of word lines, and a control circuit coupled to the non-volatile memory cells. The control circuit is configured to determine a first initial program voltage for non-volatile memory cells coupled to a first word line, and a second initial program voltage for non-volatile memory cells coupled to a second word line. The first initial program voltage and the second initial program voltage vary based on a number of program erase cycles.

One embodiment includes a method including dividing a first plurality of word lines into a first word line zone and a second plurality of word lines into a second word line zone, determining a first initial program voltage for the first word line zone, and a second initial program voltage for the second word line zone, wherein the first initial program voltage and the second initial program voltage are determined based on a number of program erase cycles, applying a single program pulse comprising the first initial program voltage to program non-volatile memory cells coupled to the first plurality of word lines to a programmed state without performing any verify operations, and applying a single program pulse comprising the second initial program voltage to program non-volatile memory cells coupled to the second plurality of word lines to the programmed state without performing any verify operations.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. An apparatus comprising:
   a plurality of word lines comprising a plurality of word line zones;
   a plurality of non-volatile memory cells coupled to the plurality of word lines; and
   a control circuit coupled to the non-volatile memory cells, the control circuit configured to determine a corresponding initial program voltage for each of the word line zones, wherein each corresponding initial program voltage is determined based on a number of program erase cycles,
   wherein for each word line zone, the control circuit is configured to determine the corresponding initial program voltage based on an average increase of a programmed state threshold voltage position across word lines in the word line zone.

2. The apparatus of claim 1, wherein the programmed state is a lowest programmed state.

3. The apparatus of claim 1, wherein for each word line zone, the control circuit is configured to determine the corresponding initial program voltage based on an average increase of a lower tail of a programmed state threshold voltage distribution.

4. The apparatus of claim 3, wherein the programmed state is a first programmed state above an erased state.

5. The apparatus of claim 1, wherein each word line zone includes consecutive word lines.

6. The apparatus of claim 1, wherein each word line zone includes a same number of word lines.

7. The apparatus of claim 1, wherein a number of word lines in each word line zone varies from word line zone to word line zone.

8. The apparatus of claim 1, wherein the word line zones are non-overlapping.

9. The apparatus of claim 1, wherein each word line is included in at most one word line zone.

10. An apparatus comprising:
    a plurality of word lines comprising a plurality of word line zones;
    a plurality of non-volatile memory cells coupled to the plurality of word lines; and
    a control circuit coupled to the non-volatile memory cells, the control circuit configured to determine a first initial program voltage for non-volatile memory cells coupled to a first word line, and a second initial program voltage for non-volatile memory cells coupled to a second word line, wherein the first initial program voltage and the second initial program voltage vary based on a number of program erase cycles,
    wherein the control circuit is further configured to determine the first initial program voltage based on an average increase of a lower tail of a programmed state threshold voltage distribution for memory cells coupled to the first word line, and determine the second initial program voltage based on an average increase of a lower tail of the programmed state threshold voltage distribution for memory cells coupled to the second word line.

11. The apparatus of claim 10, wherein the first initial program voltage differs from the second initial program voltage.

12. The apparatus of claim 10, wherein the control circuit is further configured to determine the first initial program voltage based on an average increase of a programmed state threshold voltage position of non-volatile memory cells coupled to the first word line, and determine the second initial program voltage based on an average increase of the programmed state threshold voltage position of non-volatile memory cells coupled to the second word line.

13. The apparatus of claim 12, wherein the programmed state is a lowest programmed state.

14. The apparatus of claim 10, wherein the programmed state is a first programmed state above an erased state.

15. The apparatus of claim 10, further comprising a first word line zone that comprises the first word line, and a second word line zone that comprises the second word line.

16. The apparatus of claim 10, wherein the first word line zone includes a first number of word lines, and the second word line zone includes a second number of word lines different from the first number of word lines.

17. A method comprising:
    dividing a first plurality of word lines into a first word line zone and a second plurality of word lines into a second word line zone;

determining an average increase of a programmed state threshold voltage position in the first word line zone;

determining an average increase of a programmed state threshold voltage position in the second word line zone;

determining a first initial program voltage for the first word line zone based on a number of program erase cycles and the determined average increase of a programmed state threshold voltage position in the first word line zone;

determining a first initial program voltage for the first word line zone based on the number of program erase cycles and the determined average increase of a programmed state threshold voltage position in the second word line zone;

applying a single program pulse comprising the first initial program voltage to program non-volatile memory cells coupled to the first plurality of word lines to a programmed state without performing any verify operations; and applying a single program pulse comprising the second initial program voltage to program non-volatile memory cells coupled to the second plurality of word lines to the programmed state without performing any verify operations.

18. The method of claim 17, wherein first initial program voltage differs from the second initial program voltage.

* * * * *